(12) United States Patent
Bai et al.

(10) Patent No.: US 9,819,318 B2
(45) Date of Patent: Nov. 14, 2017

(54) ARCHITECTURE OF A LOW BANDWIDTH PREDISTORTION SYSTEM FOR NON-LINEAR RF COMPONENTS

(75) Inventors: Chunlong Bai, Kanata (CA); Chunyun Jian, Ottawa (CA); Edward Sich, Ottawa (CA)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 1200 days.

(21) Appl. No.: 13/333,422

(22) Filed: Dec. 21, 2011

(65) Prior Publication Data

US 2013/0163694 A1 Jun. 27, 2013

(51) Int. Cl.
*H03F 3/24* (2006.01)
*H03F 1/32* (2006.01)
*H03F 3/195* (2006.01)
*H04B 1/04* (2006.01)

(52) U.S. Cl.
CPC ........... *H03F 3/245* (2013.01); *H03F 1/3247* (2013.01); *H03F 1/3258* (2013.01); *H03F 3/195* (2013.01); *H04B 1/0475* (2013.01); *H03F 2201/3209* (2013.01); *H03F 2201/3212* (2013.01); *H03F 2201/3224* (2013.01); *H04B 2001/0425* (2013.01)

(58) Field of Classification Search
USPC ................................. 375/297, 296, 324, 354
See application file for complete search history.

(56) References Cited

U.S. PATENT DOCUMENTS 5,923,712 A 7/1999 Leyendecker et al.
6,141,390 A 10/2000 Cova
6,320,463 B1 11/2001 Leva et al.
(Continued)

FOREIGN PATENT DOCUMENTS

EP 1335489 A1 8/2003
EP 1517500 A1 3/2005
(Continued)

OTHER PUBLICATIONS

Non-Final Office Action for U.S. Appl. No. 13/333,391, dated Mar. 15, 2013, 10 pages.
(Continued)

*Primary Examiner* — Kabir A Timory
(74) *Attorney, Agent, or Firm* — Withrow & Terranova, PLLC

(57) ABSTRACT

Systems and methods for compensating for non-linearity of a non-linear subsystem using predistortion are disclosed. In one embodiment, a system includes a non-linear subsystem and a predistorter configured to effect predistortion of an input signal of the non-linear subsystem such that the predistortion compensates for a non-linear characteristic of the non-linear subsystem. In addition, the system includes a narrowband filter that filters a feedback signal that is representative of an output signal of the non-linear subsystem to provide a filtered feedback signal, and an adaptor that adaptively configures the predistorter based on the filtered feedback signal and a reference signal that is representative of an input signal of the non-linear subsystem. By utilizing the filtered feedback signal, rather than the feedback signal, a complexity, and therefore, cost of the adaptor is substantially reduced.

20 Claims, 23 Drawing Sheets

(56) References Cited

U.S. PATENT DOCUMENTS

| | | |
|---|---|---|
| 6,600,516 B1 | 7/2003 | Danielsons et al. |
| 6,947,711 B1 | 9/2005 | Leyonhjelm |
| 7,330,517 B2 | 2/2008 | Taler et al. |
| 7,469,491 B2 | 12/2008 | McCallister et al. |
| 2003/0179831 A1* | 9/2003 | Gupta et al. .................. 375/296 |
| 2005/0111575 A1 | 5/2005 | Taler et al. |
| 2005/0163268 A1 | 7/2005 | McCallister |
| 2005/0253745 A1 | 11/2005 | Song et al. |
| 2007/0082617 A1 | 4/2007 | McCallister |
| 2007/0087704 A1 | 4/2007 | Gilberton |
| 2010/0329387 A1 | 12/2010 | Watanabe |
| 2011/0095820 A1 | 4/2011 | Hou et al. |
| 2013/0077713 A1* | 3/2013 | Kim et al. .................... 375/297 |
| 2013/0243117 A1 | 9/2013 | Jeckeln |

FOREIGN PATENT DOCUMENTS

| | | |
|---|---|---|
| EP | 2161841 A1 | 3/2010 |
| EP | 2175555 A1 | 4/2010 |
| WO | 0070750 A1 | 11/2000 |
| WO | 2013044238 A1 | 3/2013 |

OTHER PUBLICATIONS

International Search Report and Written Opinion for PCT/IB2012/057566, dated Apr. 24, 2013, 13 pages.
International Search Report and Written Opinion for PCT/IB2012/057568, dated May 13, 2013, 9 pages.
Non-Final Office Action for U.S. Appl. No. 13/333,407, dated Jun. 4, 2013, 14 pages.
Non-Final Office Action for U.S. Appl. No. 13/333,391, dated Aug. 20, 2013, 10 pages.
Bandler, John W. et al, "Space Mapping: The State of the Art," IEEE Tranascations on Microwave Theory and Techniques, Jan. 2004, pp. 337-361, vol. 52, No. 1.
International Search Report and Written Opinion for PCT/IB2012/057569, dated Jun. 27, 2013, 12 pages.
International Search Report and Written Opinion for PCT/IB2013/051754, dated Jul. 11, 2013, 8 pages.
Ueda, M. et al., "Investigation on nonlinear distortion of acoustic devices for radio-frequency applications and its suppression," 2009 IEEE International Ultrasonics Symposium, Sep. 2009, pp. 876-879.
Tsutsumi J. et al., "Influence of linear and non-linear distortions in SAW/FBAR duplexers for 3rd generation mobile phone systems," Proceedings of the European Microwave Association, vol. 3, Jun. 2007, pp. 120-127.
Zhang, Q. J., "Artifical Neural Networks for RF and Microwave design: From theory to practice," Nov. 26, 2002, 55 pages, http://www.doe.carleton.ca/~qjz/ANN_Tutorial/Slides/ANN_Tutorial_Slides_11-26-02.pps.
Bandler, J. W. et al.,"Space mapping: the state of the art," IEEE Transactions Microwave on Theory and Techniques, vol. 52 No. 1, Jan. 2004, pp. 337-361.
Zhang, L. et al., "Efficient analytical formulation and sensitivity analysis of neuro-space mapping for nonlinear microwave device modeling," IEEE Transactions Microwave on Theory and Techniques, vol. 53 No. 9, Sep. 2005, pp. 2752-2767.
Zhang, L. et al., "Neuro-space mapping technique for nonlinear device modeling and large signal simulation," IEEE MTT-S Internatinoal Microwave Symposium Digest, Jun. 8-13, 2003, pp. 173-176.
Zhang, L. et al., "Neuro-space mapping technique for semiconductor device modeling," Optimization and Engineering, vol. 9 No. 4, 2008, pp. 393-405.
Bandler, J. W. et al., "Why space mapping works," Surrogate modelling and space mapping for engineering optimization, Lyngby, Denmark, Nov. 9-11, 2006, 41 pages.
Benvenuto, N. et al. "A neural network approach to data predistortion with memory in digital radio systems," Proceedings of IEEE ICC, 1993, pp. 232-236.
Liu, T. et al. "Dynamic Behavioral Modeling of 3G Power Amplifiers Using Real-Valued Time-Delay Neural Networks," IEEE Transactions Microwave Theory and Techniques, vol. 52, No. 3, Mar. 2004, pp. 1025-1033.
Luongvyinh, D. et al. "Behavioral modeling of power amplifiers using fully recurrent neural networks," IEEE MTT-S International Microwave Symposium Digest, Jun. 12-17, 2005, pp. 1979-1982.
Ibnkahla, M. et al. "Neural networks for modeling nonlinear memoryless communication channels," IEEE Transactions on Communications, vol. 45, No. 7 Jul. 1997, pp. 768-771.
Mkadem, F. et al. "Physically Inspired Neural Network Model for RF Power Amplifier Behavioral Modeling and Digital Predistortion," IEEE Transactions Microwave on Theory and Techniques, vol. 59, No. 4, Apr. 2011, pp. 913-923.
Naskas, N. et al. "Adaptive baseband predistorter for radio frequency power amplifiers based on a multilayer perceptron," 9th International Conference on Electronics, Circuits and Systems, vol. 3, Dec. 10, 2002, pp. 1107-1110.
Olurotimi, O., "Recurrent neural network training with feedforward complexity," IEEE Transactions on Neural Networks, vol. 5, No. 2, Mar. 1994, pp. 185-197.
Pedro, J. et al. "A Comparative Overview of Microwave and Wireless Power-Amplifier Behavioral Modeling Approaches," IEEE Transactions Microwave on Theory and Techniques, vol. 58, No. 1, Apr. 2005, pp. 1150-1163.
Rawat, M. et al. "Adaptive Digital Predistortion of Wireless Power Amplifiers/Transmitters Using Dynamic Real-Valued Focused Time-Delay Line Neural Networks," IEEE Transactions Microwave Theory and Techniques, vol. 58, No. 1, Jan. 2010, pp. 95-104.
Zhang, Q. et al., "Artificial Neural Networks for RF and Microwave Design: From Theory to Practice," IEEE Transactions on Microwave Theory and Techniques, vol. 51, No. 4, Part 2, Apr. 2003, pp. 1339-1350.
Notice of Allowance for U.S. Appl. No. 13/333,407, dated Oct. 7, 2013, 9 pages.
Final Office Action for U.S. Appl. No. 13/333,391 dated Feb. 4, 2014, 12 pages.
Non-final Office Action for U.S. Appl. No. 13/443,949 dated Jan. 3, 2014, 6 pages.
Written Opinion of the International Preliminary Examining Authority for PCT/IB2012/057569, dated Mar. 27, 2014, 6 pages.
International Preliminary Report on Patentability for PCT/IB2012/057569, dated May 26, 2014, 9 pages.
Non-final Office Action for U.S. Appl. No. 13/333,391 dated May 6, 2014, 10 pages.
Notice of Allowance and Examiner-Initiated Interview Summary for U.S. Appl. No. 13/443,949 dated Apr. 14, 2014, 9 pages.
International Preliminary Report on Patentability for PCT/IB2012/057566, dated Jul. 3, 2014, 8 pages.
International Preliminary Report on Patentability for PCT/IB2012/057568, dated Jul. 3, 2014, 7 pages.
Non-Final Office Action for U.S. Appl. No. 13/333,391 dated Oct. 29, 2014, 11 pages.
International Preliminary Report on Patentability for PCT/IB2013/051754, dated Sep. 25, 2014, 5 pages.
Final Office Action for U.S. Appl. No. 13/333,391, dated May 4, 2015, 11 pages.

* cited by examiner

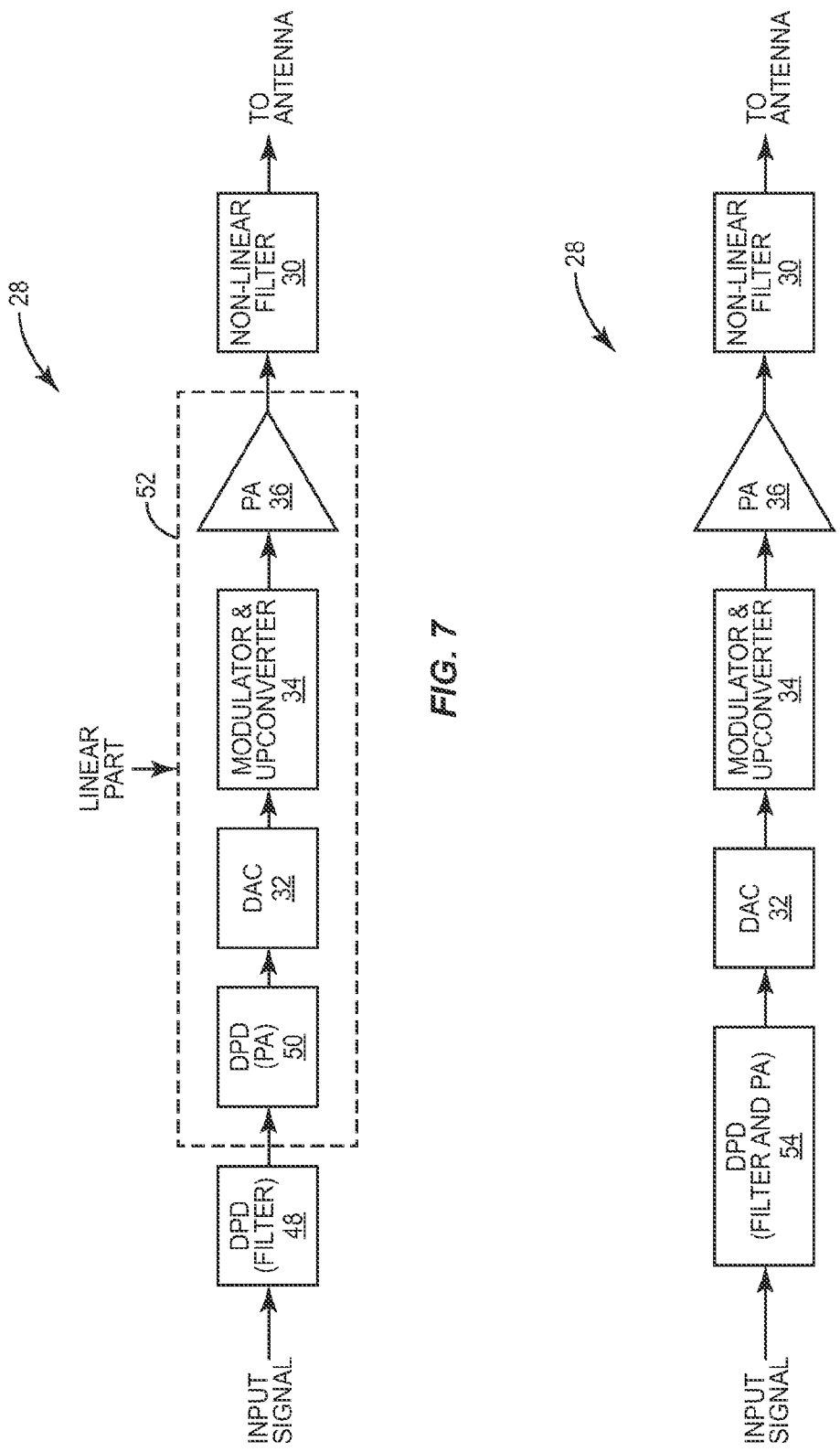

ARCHITECTURE OF A LOW BANDWIDTH PREDISTORTION SYSTEM FOR NON-LINEAR RF COMPONENTS

RELATED APPLICATIONS

This application is related to U.S. patent application Ser. No. 13/333,391, entitled ARCHITECTURE OF NONLINEAR RF FILTER-BASED TRANSMITTER, which was filed Dec. 21, 2011; and U.S. patent application Ser. No. 13/333 407, entitled ADAPTIVE PREDISTORTION FOR A NON-LINEAR SUBSYSTEM BASED ON A MODEL AS A CONCATENATION OF A NON-LINEAR MODEL FOLLOWED BY A LINEAR MODEL, which was filed Dec. 21, 2011; both of which are commonly owned and assigned and are hereby incorporated herein by reference in their entireties.

FIELD OF THE DISCLOSURE

The present disclosure relates to linearization of a non-linear subsystem using predistortion and, in many embodiments, relates to linearization of a non-linear filter at an output of a radio frequency transmitter using predistortion.

BACKGROUND

Every node in a communication network that desires to send data must have a transmitter. For instance, in a cellular communication network, transmitters are found in base stations as well as user equipment devices, or terminals. FIG. 1 illustrates one embodiment of a conventional transmitter 10. The transmitter 10 may be a transmitter of a wireless base station or a transmitter of a user equipment device. As shown, the transmitter 10 includes a digital-to-analog converter (DAC) 12 followed by a modulator and upconverter 14. The output of the modulator and upconverter 14 is amplified by a power amplifier (PA) 16 and then filtered by a filter 18. FIG. 2 illustrates another embodiment of the conventional transmitter 10, which is similar to that illustrated in FIG. 1. However, in this embodiment, the transmitter 10 includes a digital predistorter (DPD) 20 that operates to predistort the input signal to compensate for a non-linearity of the PA 16. An adaptor 22 adaptively configures the digital predistorter 20 based on the input signal and a feedback signal provided from the output of the PA 16 via a demodulator and downconverter 24 and an analog-to-digital converter (ADC) 26.

Ideally, the filter 18 is a linear filter. However, all analog filters, including the filter 18, have a non-linear characteristic region. The non-linear characteristic of the filter 18 results in several disadvantages when the transmitter 10 is implemented in a base station of a cellular communication network for 4-th Generation (4G) cellular communication networks such as, for example, Long Term Evolution (LTE) cellular communication networks. More specifically, next generation cellular communication networks will have macro base stations that operate at a high output power (e.g., ~80 watt (W) average power and ~400 W peak power) and low power base stations that operate at a lower output power (e.g., 0.1 to 10 or 20 W). With respect to the high power base stations, the only type of filter that can handle the high output power is a cavity filter. However, due to the non-linearity issue of the cavity filters the first round production yield of the cavity filter manufacturing is just around 60%. As such, manufacturing of cavity filters is very expensive. Therefore, there is a need for improving the non-linearity issue of the cavity filters to reduce the manufacturing cost.

As for the low power base stations, cavity filters can easily handle the desired output power while providing the desired linearity. However, cavity filters are very large and heavy as compared to other types of filters (e.g., ceramic filters or monoblock filters). Therefore, the use of cavity filters is not desired for the low power base stations. However, the ceramic filters and monoblock filters do not provide the desired linearity when operating in higher power, for example, higher than 5 W. Thus, there is a need for improving the non-linearities of the ceramic filters and monoblock filters so that the low power base stations operating in power range from 5 W to 20 W can use such filters instead of using the bulky cavity filter.

The conventional transmitter 10 also results in issues when implemented in user equipment devices for 4G cellular communication networks such as, for example, LTE cellular communication networks. Specifically, when the conventional transmitter 10 is implemented in a user equipment device, the filter 18 is a miniature filter such as a Surface Acoustic Wave (SAW) filter, a Film Bulk Acoustic Resonator (FBAR) filter, or a Bulk Acoustic Wave (BAW) filter. The peak power of the PA 16 in 4G cellular communication networks could push up the filter 18 to work in its non-linear region. As a result, the non-linearity of the filter would be an issue to the system. So, there is also a need for improving the nonlinearities of the miniature filters so that such miniature filters can be used in the user equipment devices for 4G wireless networks without communication quality degradation.

All of the issues discussed above stem from non-linearity that the filter 18 will show when it works above a certain power level and in its non-linear characteristic region. Therefore, there is a need for systems and methods for decreasing or eliminating the non-linearity of a non-linear filter.

SUMMARY

Systems and methods for compensating for non-linearity of a non-linear subsystem using predistortion are disclosed. In one embodiment, a system includes a non-linear subsystem and a predistorter configured to effect predistortion of an input signal of the non-linear subsystem such that the predistortion compensates for a non-linear characteristic of the non-linear subsystem. In addition, the system includes a narrowband filter that filters a feedback signal that is representative of an output signal of the non-linear subsystem to provide a filtered feedback signal, and an adaptor that adaptively configures the predistorter based on the filtered feedback signal and a reference signal that is representative of an input signal of the non-linear subsystem. By utilizing the filtered feedback signal, rather than the feedback signal, a complexity, and therefore, cost of the adaptor is substantially reduced.

In one embodiment, the system also includes a second narrowband filter that filters the reference signal representative of an input signal to the non-linear subsystem to provide a filtered reference signal, and the adaptor adaptively configures the predistorter based on the filtered feedback signal and the filtered reference signal.

In one embodiment, the system is a transmitter that includes a power amplifier configured to amplify a radio frequency input signal to provide an amplified radio frequency signal, and the non-linear system is a non-linear filter configured to filter the amplified radio frequency signal to provide an output signal.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 1:
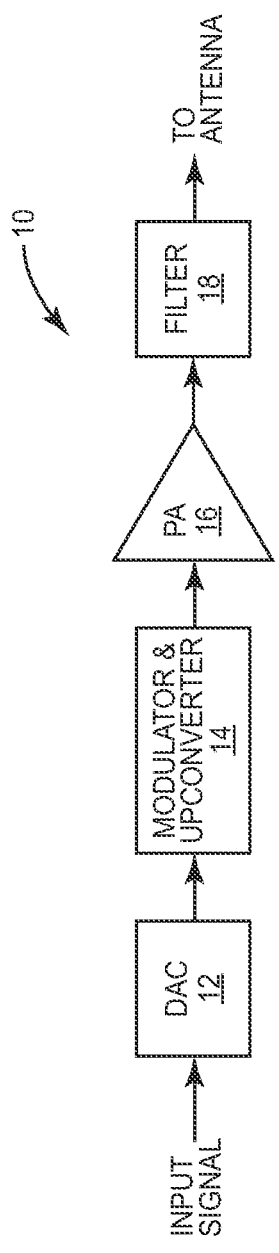
FIG. 1 illustrates one embodiment of a conventional transmitter.
Figure 2:
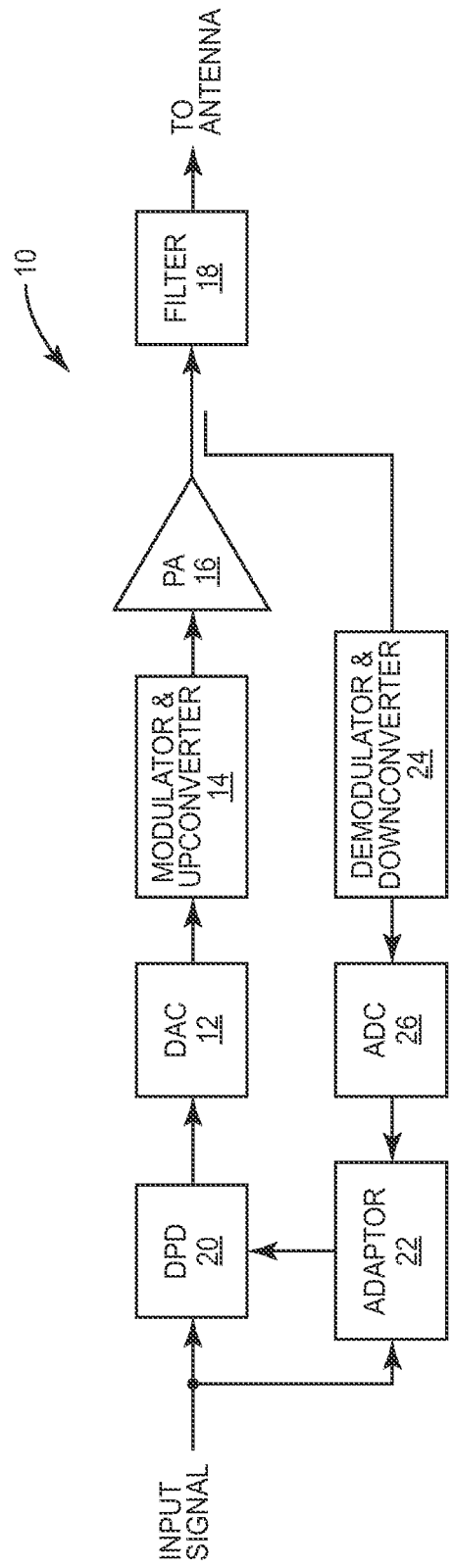
FIG. 2 illustrates another embodiment of the conventional transmitter.
Figure 3:
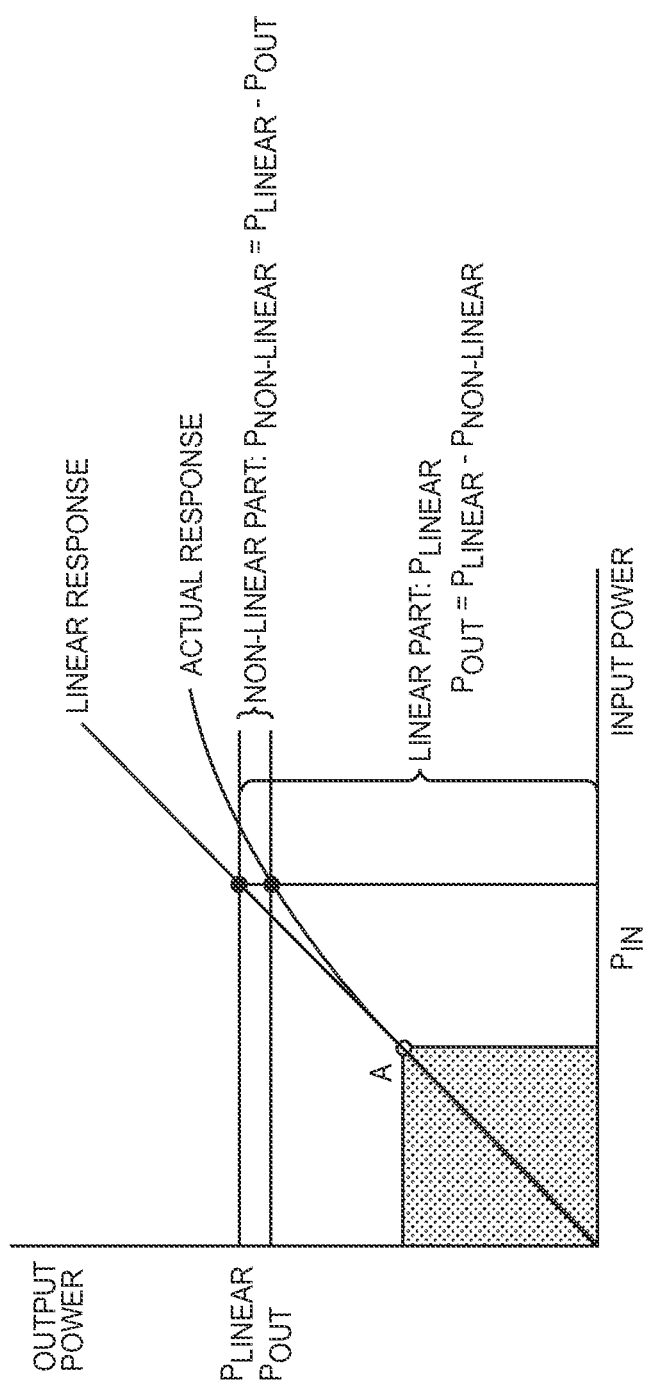
Figure 4:
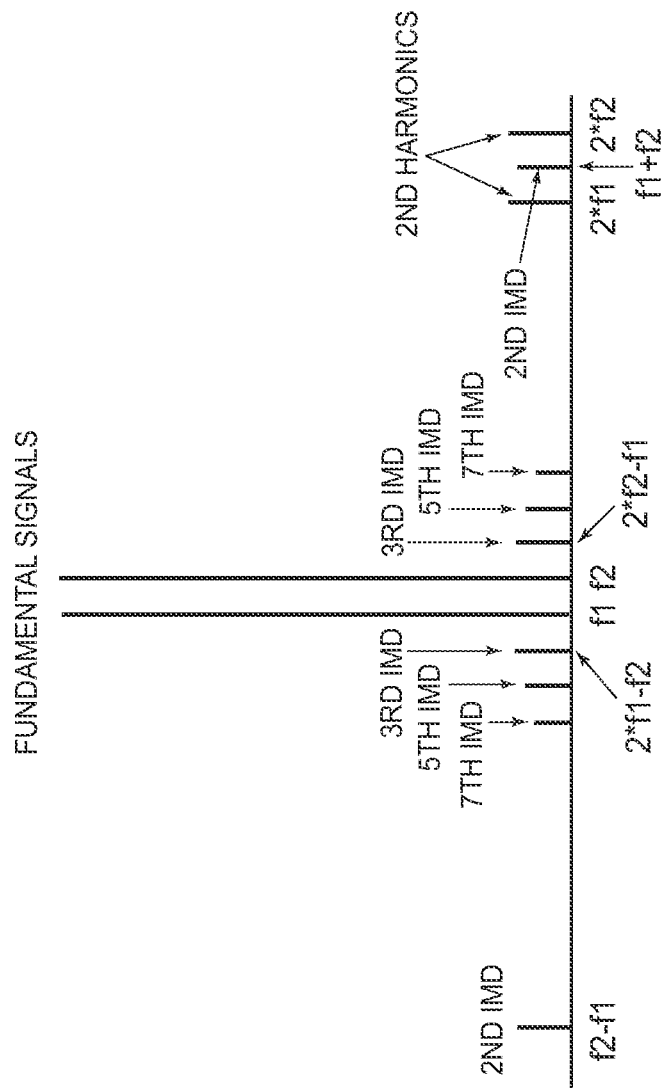
Figure 5A:
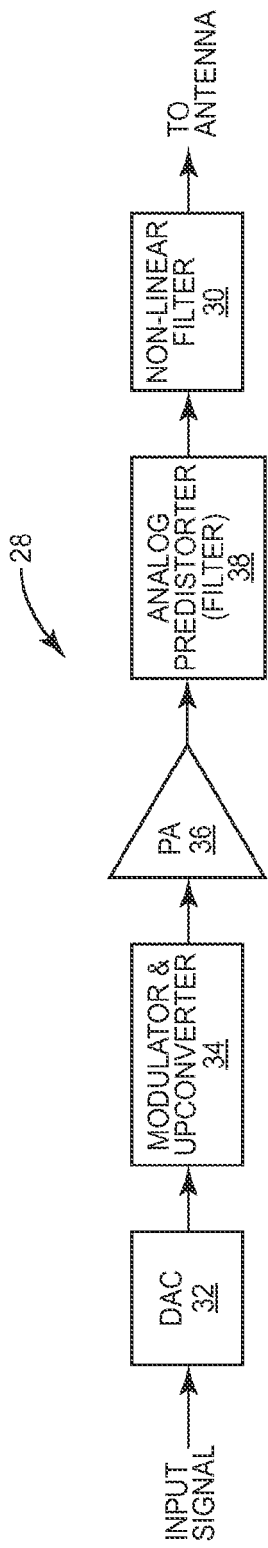
Figure 5B:
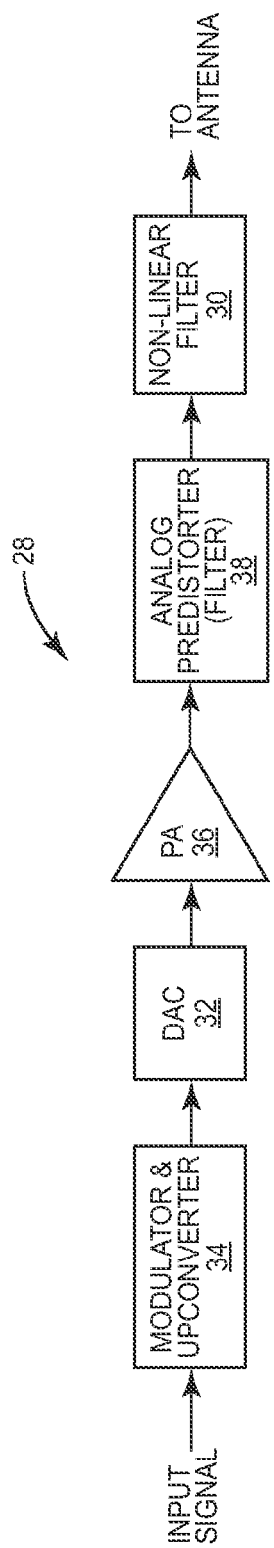
Figure 6:
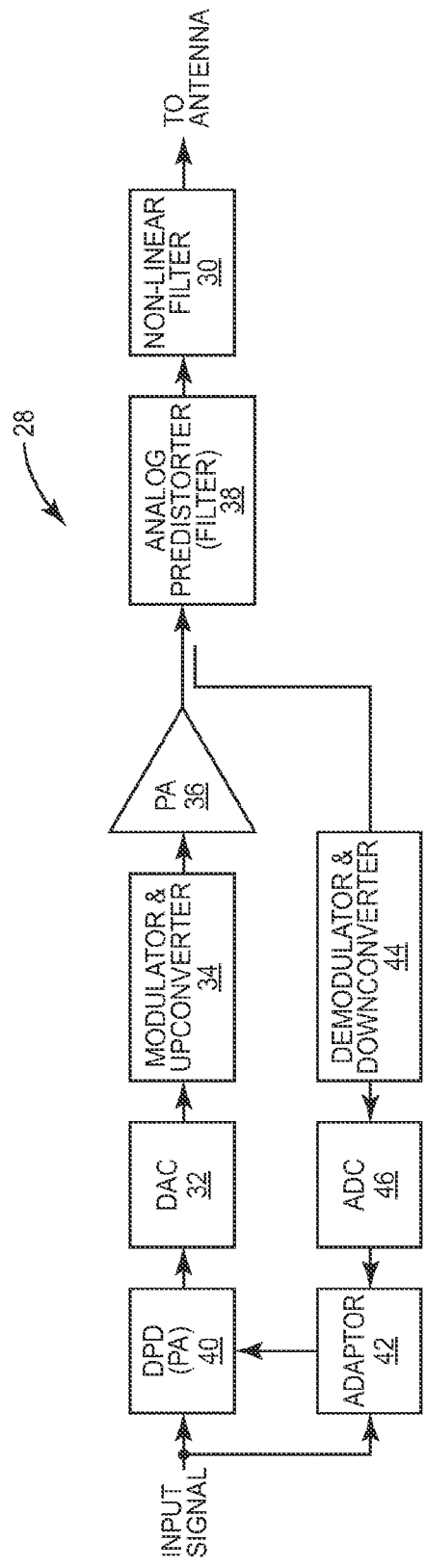
Figure 9:
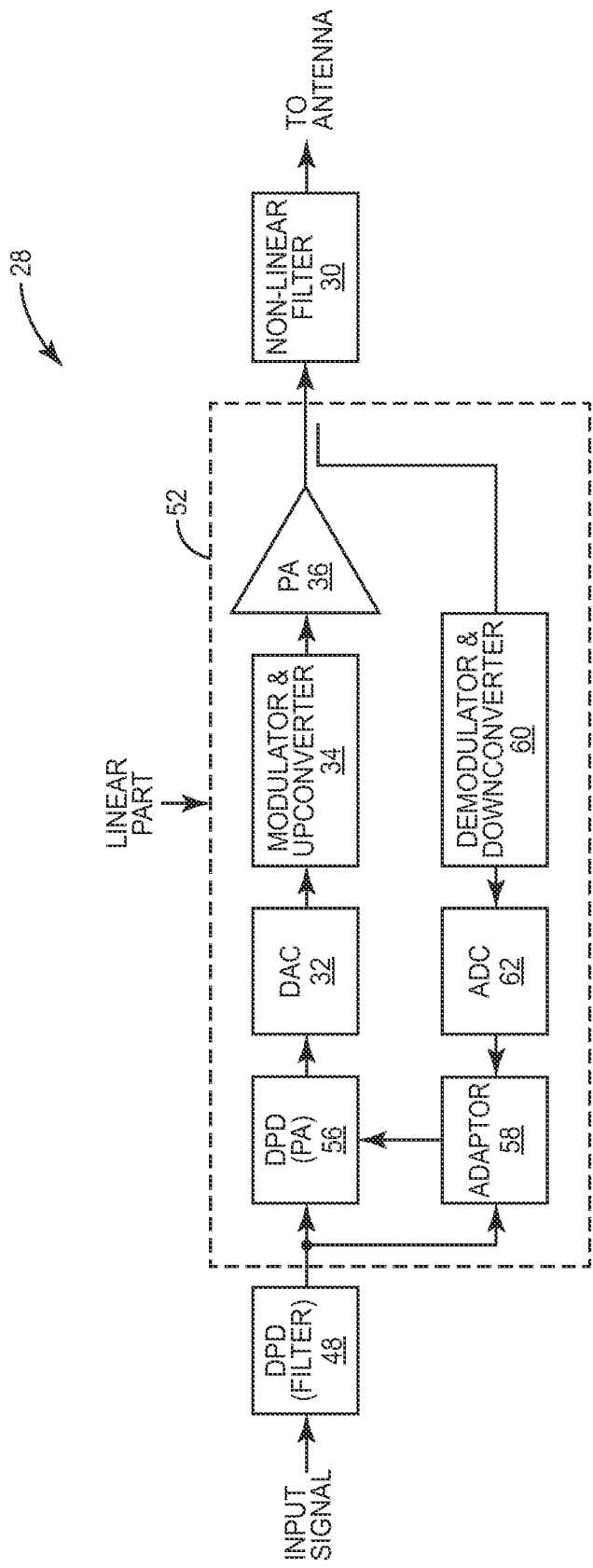
Figure 10:
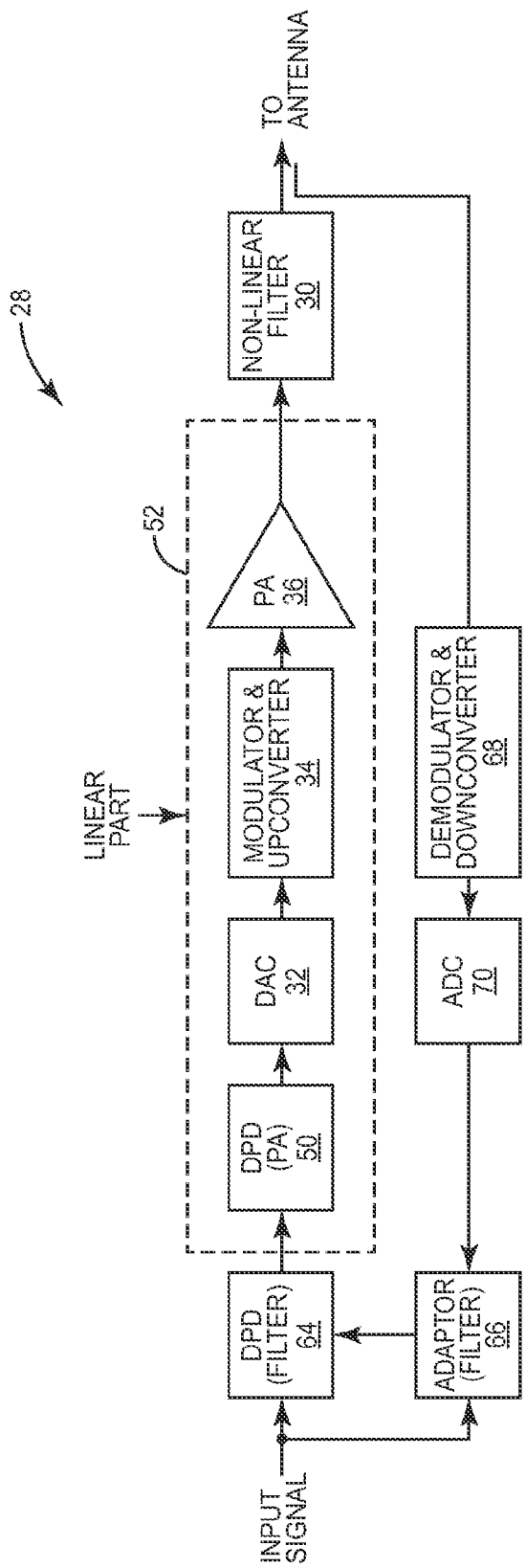
Figure 11:
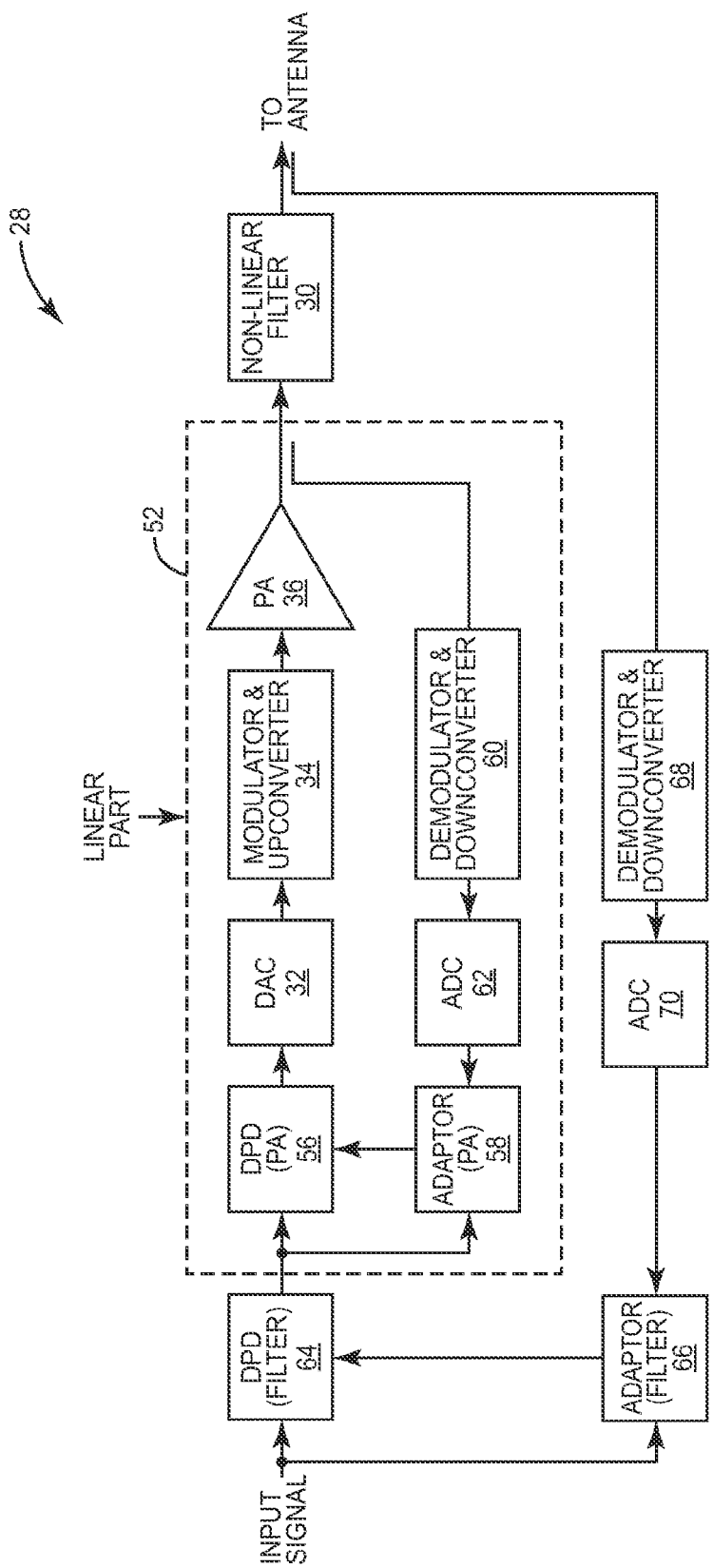
Figure 12:
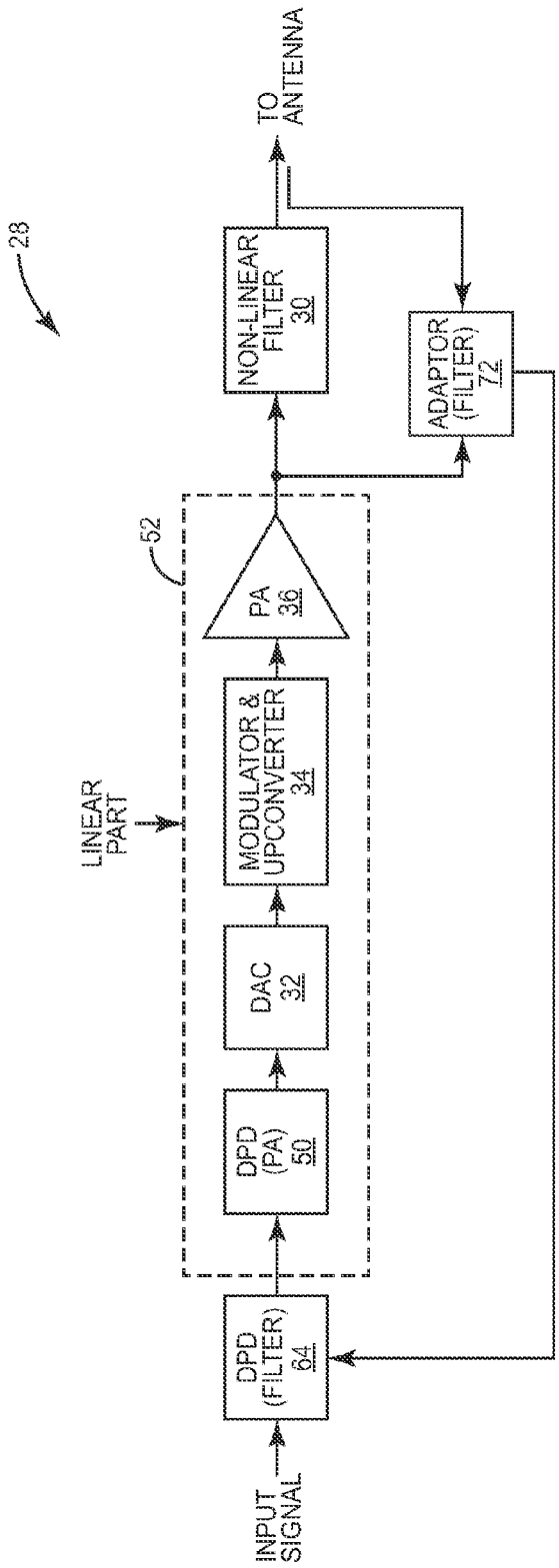
Figure 13:
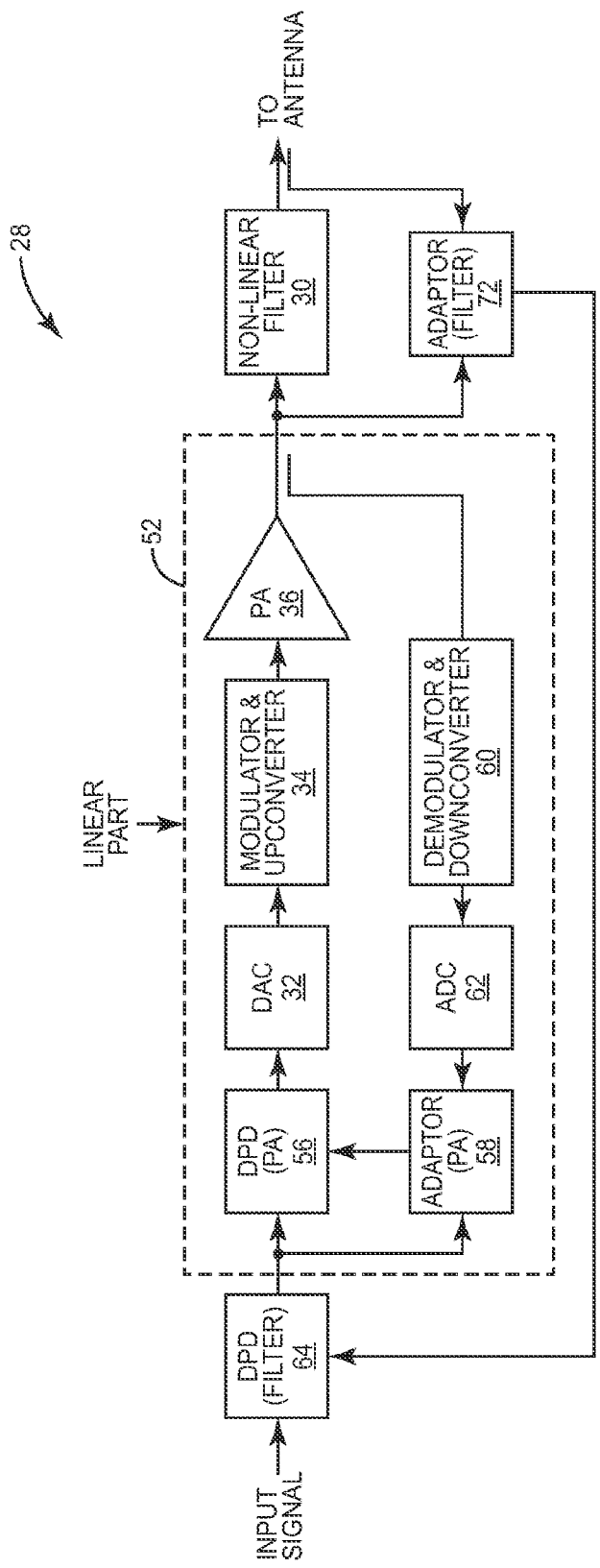
Figure 14:
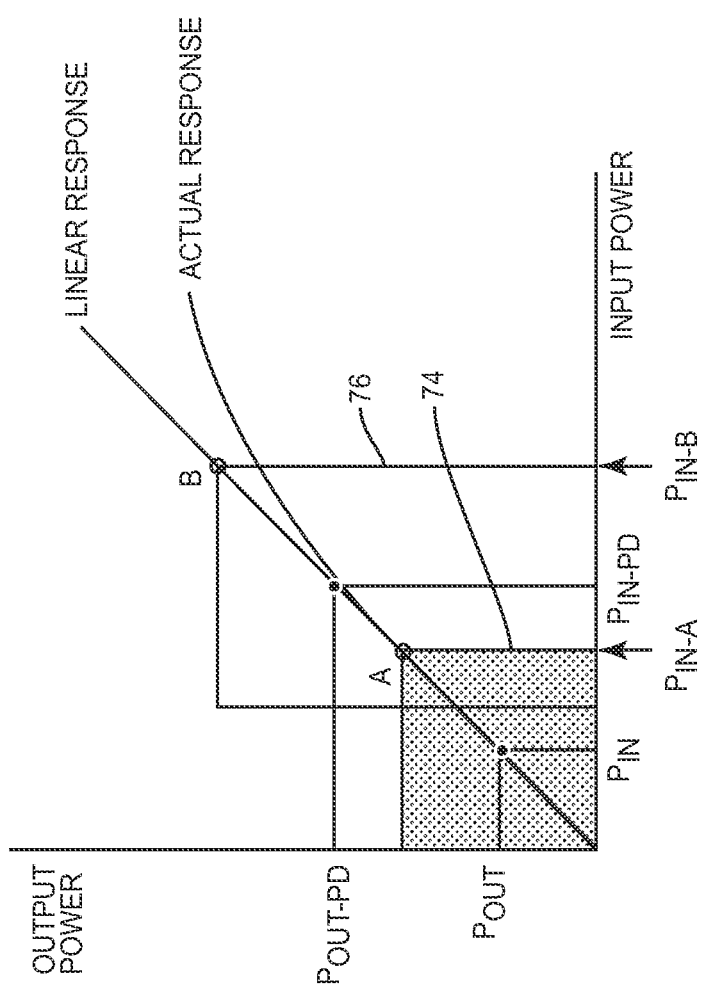
Figure 15:
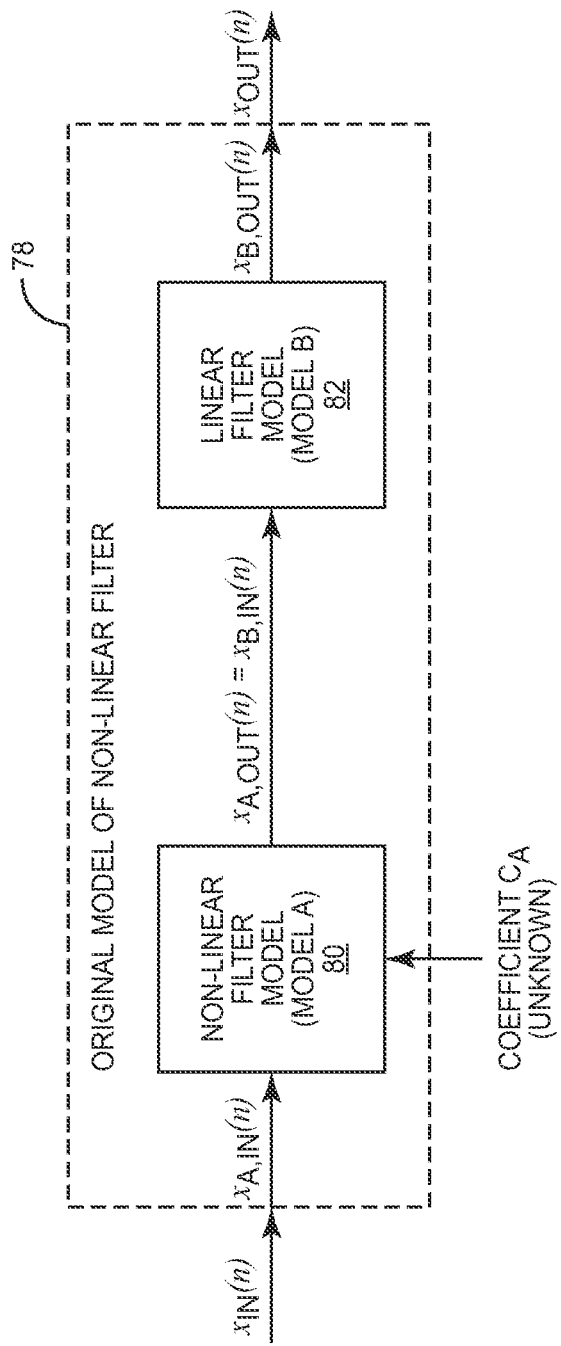
Figure 16:
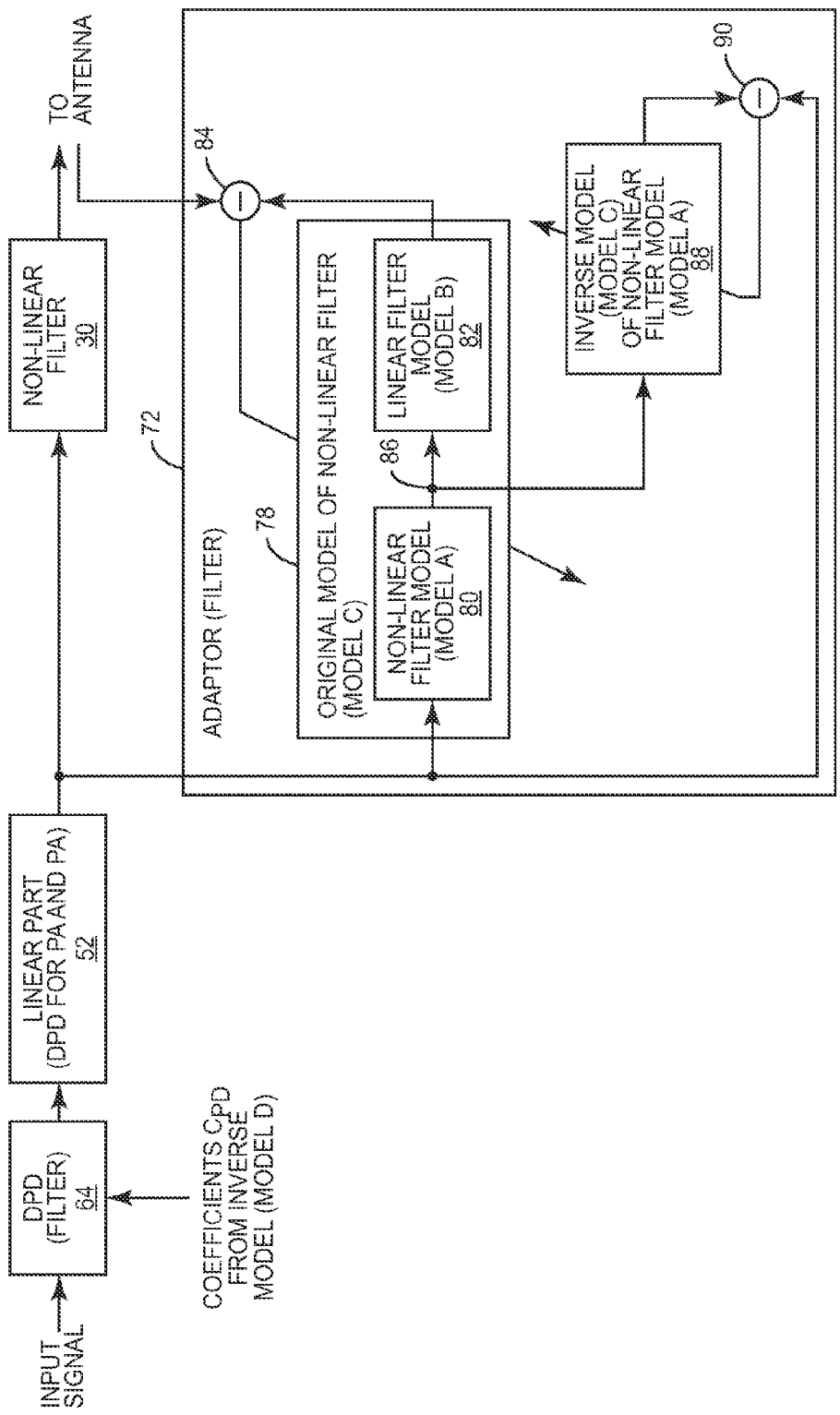
Figure 17:
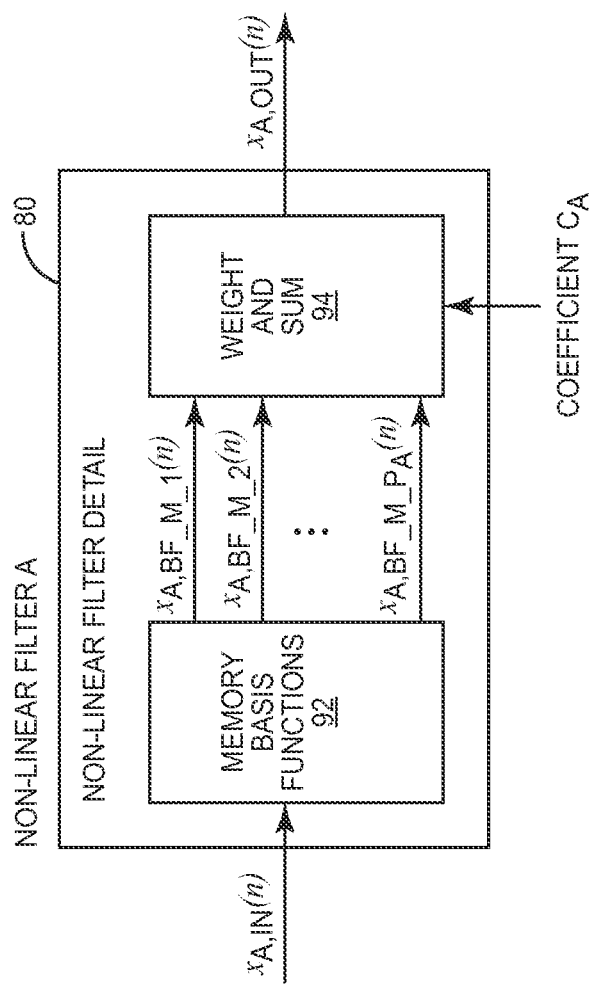
Figure 18:
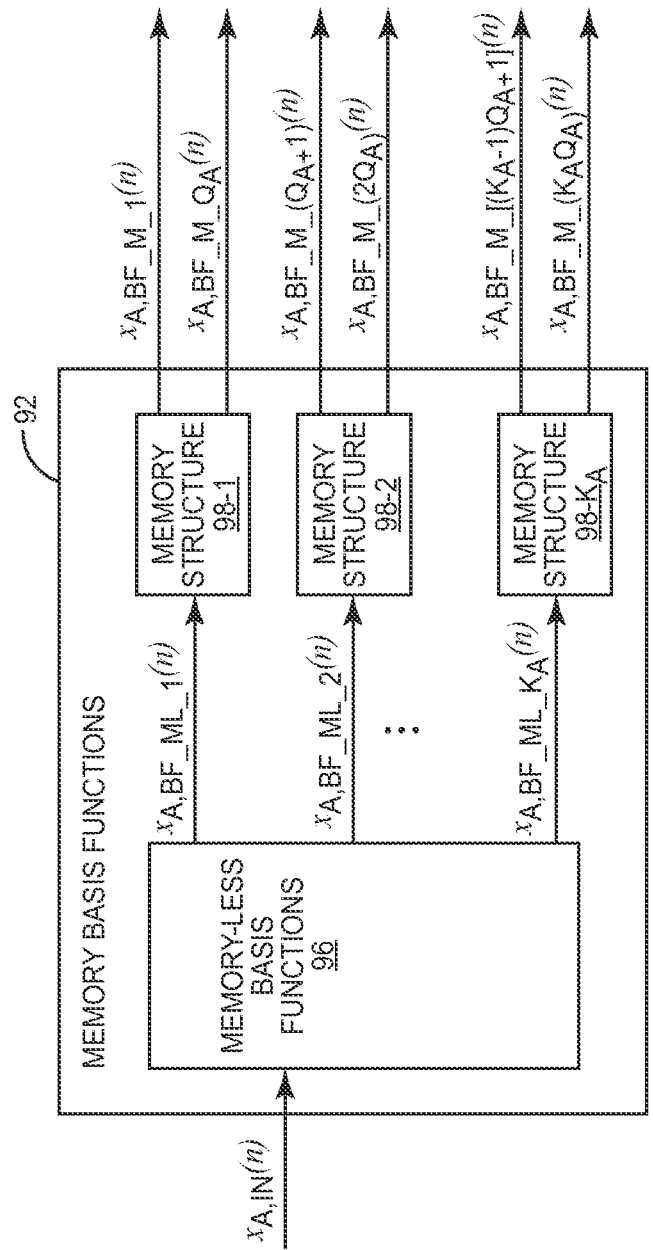
Figure 19:
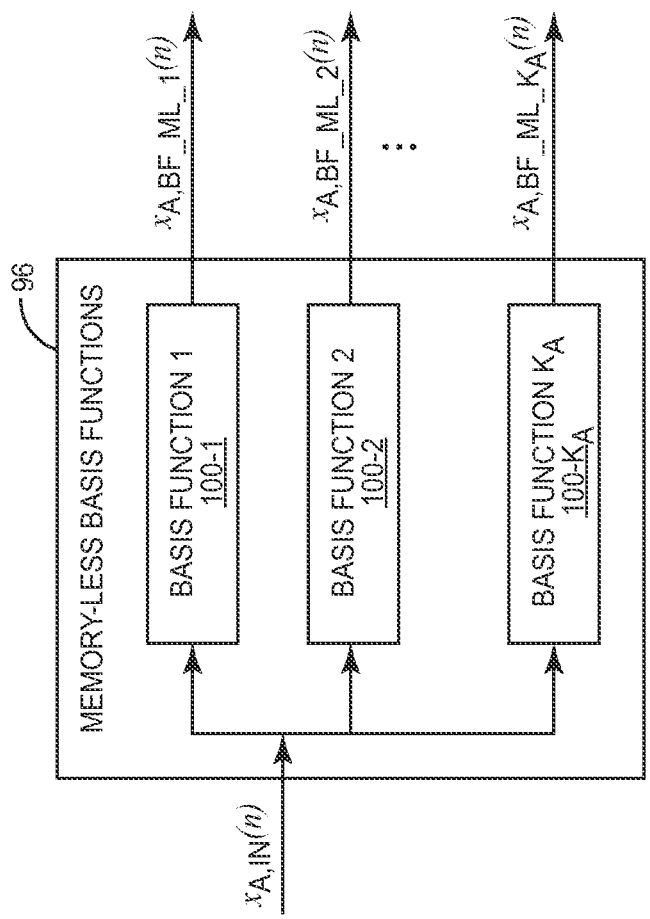
Figure 20:
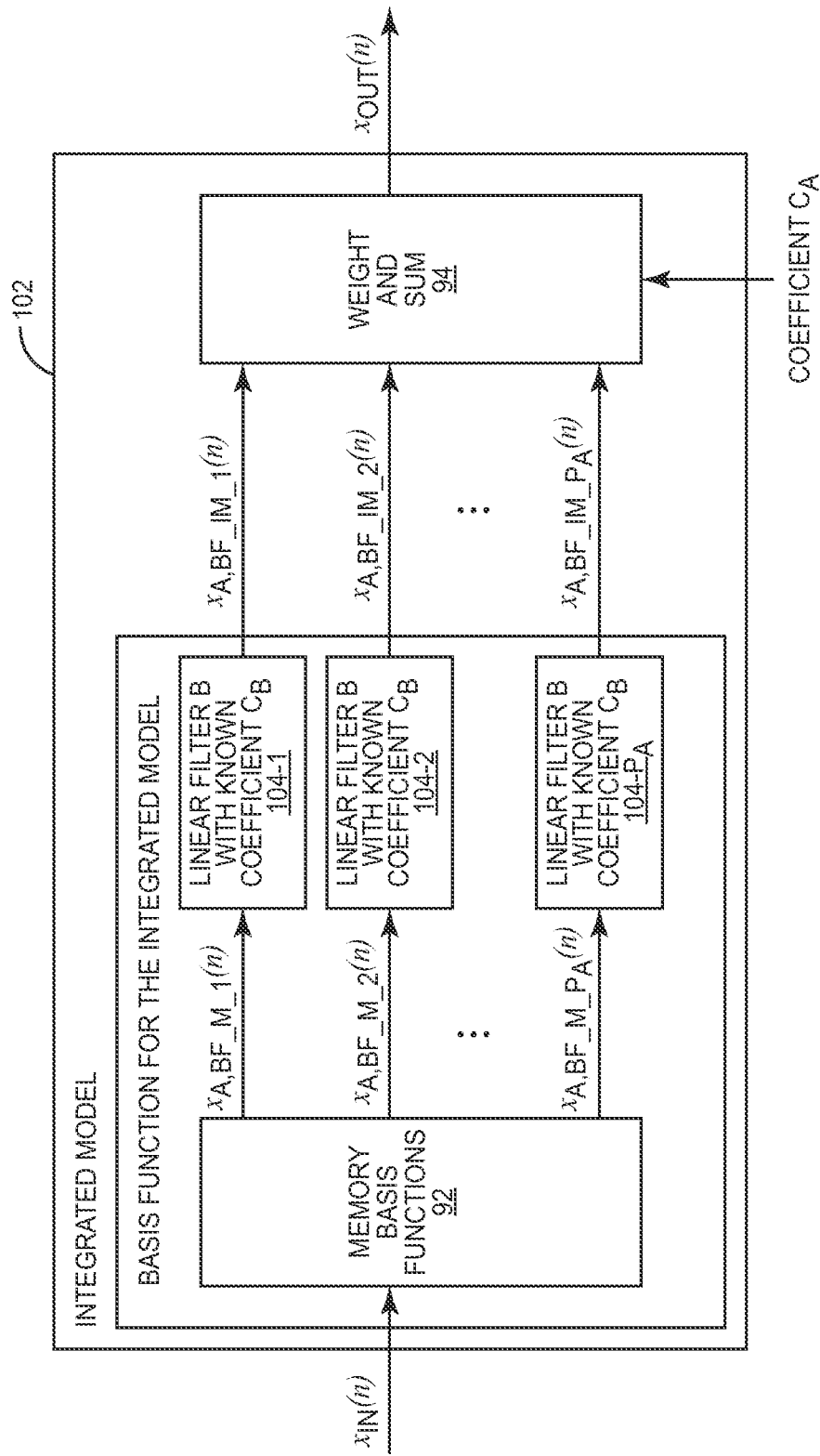
Figure 21:
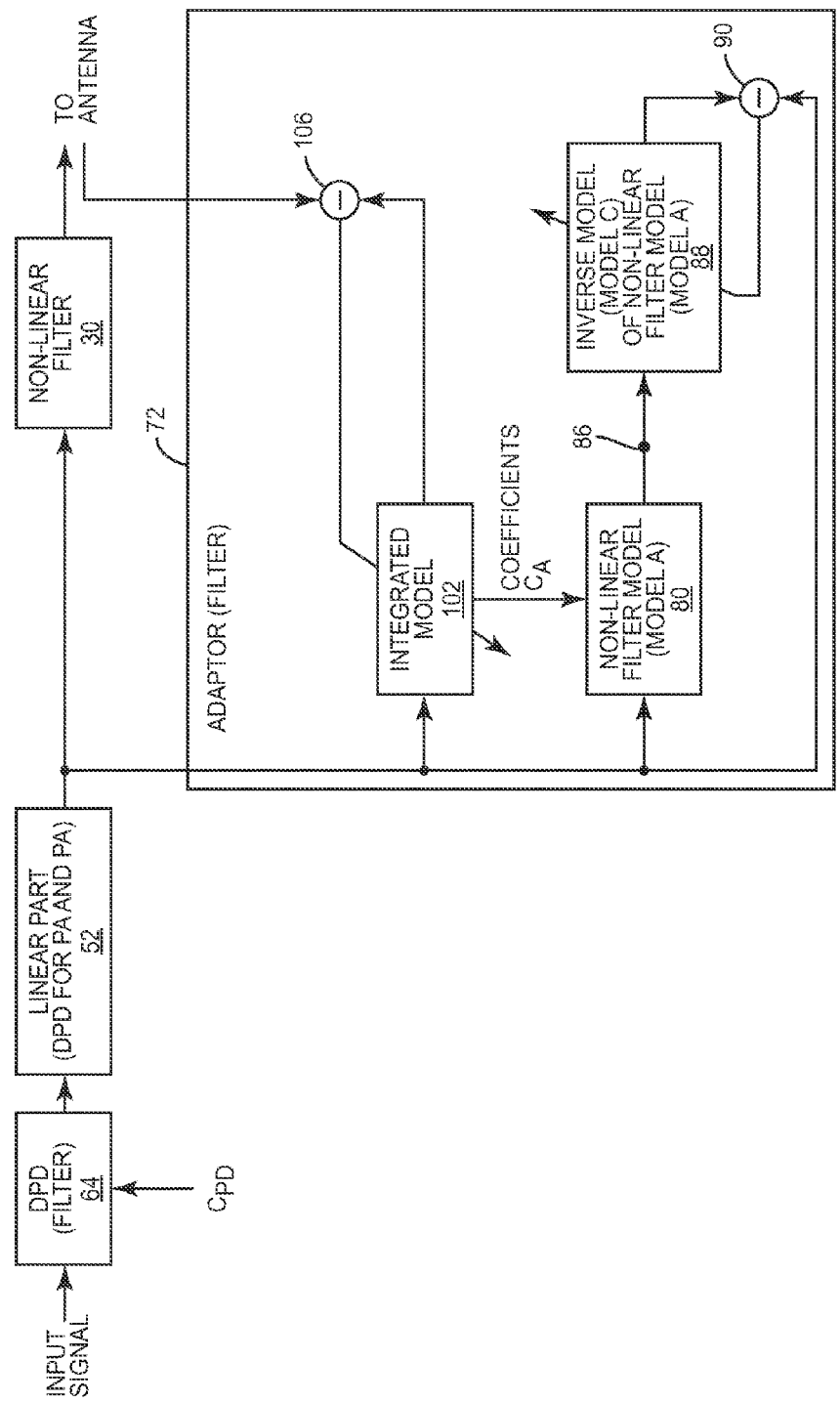
Figure 22:
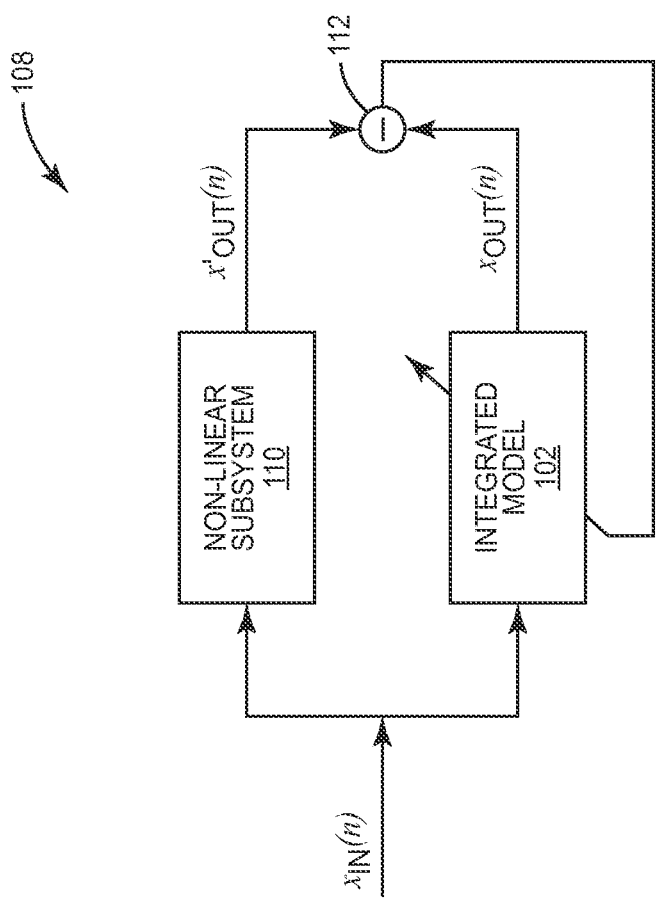
Figure 23:
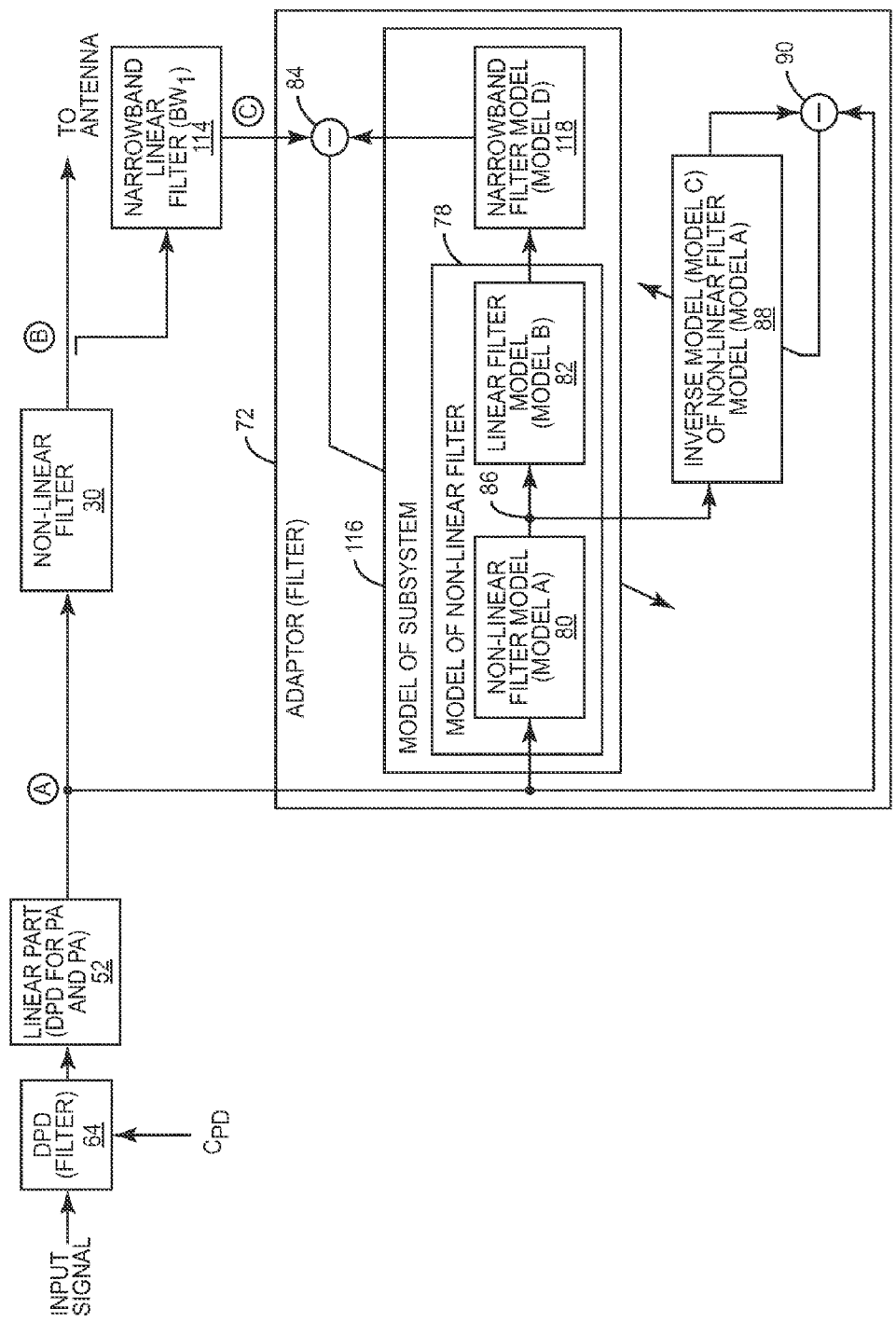
Figure 24A:
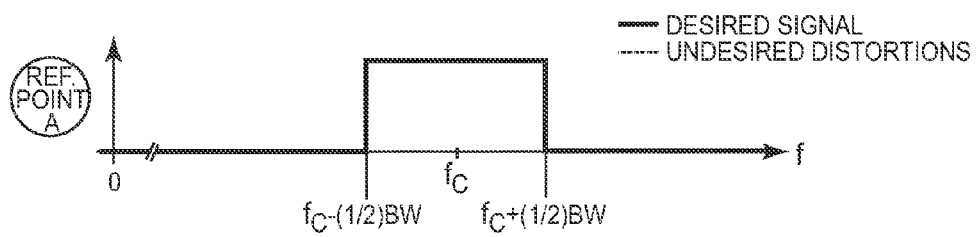
Figure 24B:
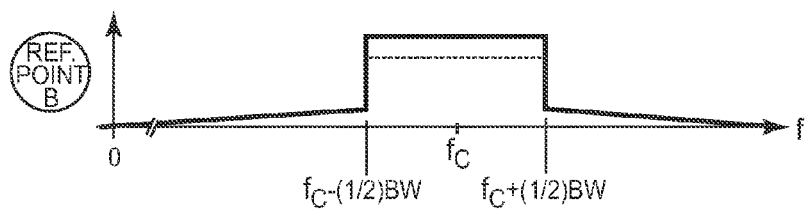
Figure 24C:
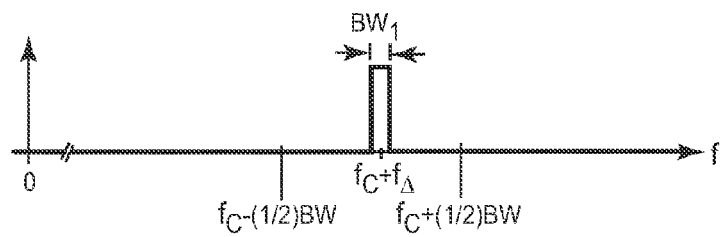
Figure 24D:
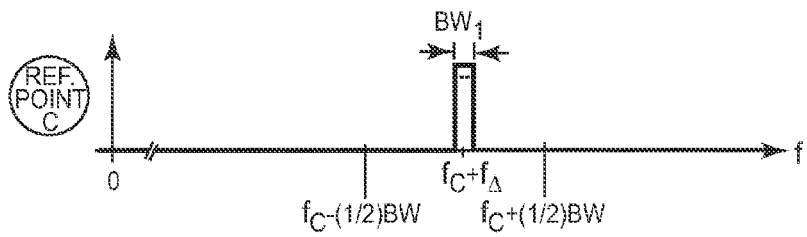
Figure 25:
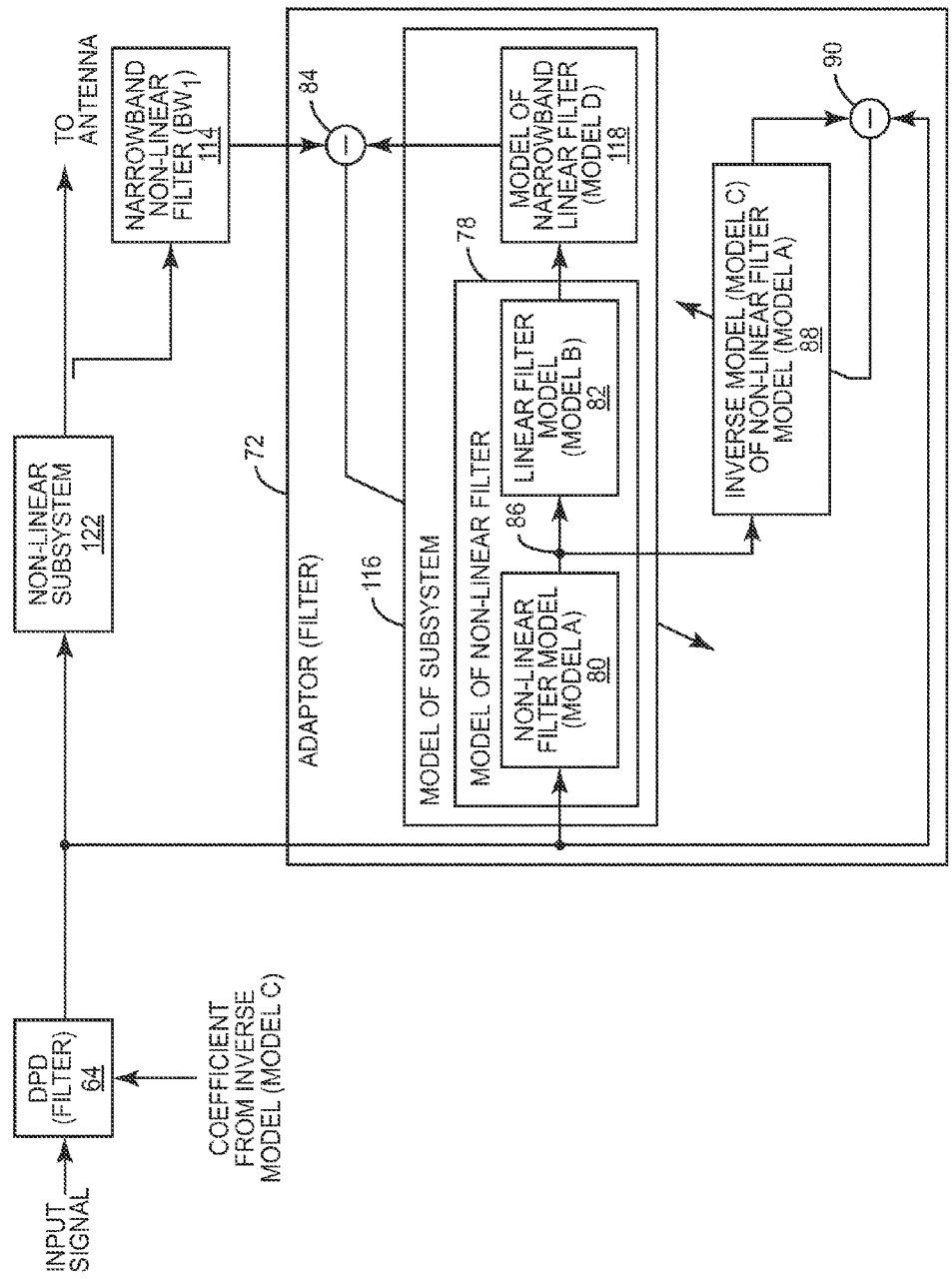

FIG. 3 graphically illustrates an input-output characteristic of a typical passive type filter showing that the passive type filter has a non-linear characteristic region at higher power levels and is therefore, in fact, a non-linear filter;

FIG. 4 graphically illustrates relationships between fundamental and lower orders of Intermodulation Distortion (IMD) and harmonics for a typical non-linear filter;

FIGS. 5A and 5B illustrate a transmitter that provides predistortion to compensate for a non-linear characteristic of a non-linear filter according to a first embodiment of the present disclosure;

FIG. 6 illustrates a transmitter that provides predistortion to compensate for a non-linear characteristic of a non-linear filter according to a second embodiment of the present disclosure;

FIG. 7 illustrates a transmitter that provides predistortion to compensate for a non-linear characteristic of a non-linear filter according to a third embodiment of the present disclosure;

FIG. 8 illustrates a transmitter that provides predistortion to compensate for a non-linear characteristic of a non-linear filter according to a fourth embodiment of the present disclosure;

FIG. 9 illustrates a transmitter that provides predistortion to compensate for a non-linear characteristic of a non-linear filter according to a fifth embodiment of the present disclosure;

FIG. 10 illustrates a transmitter that provides predistortion to compensate for a non-linear characteristic of a non-linear filter according to a sixth embodiment of the present disclosure;

FIG. 11 illustrates a transmitter that provides predistortion to compensate for a non-linear characteristic of a non-linear filter according to a seventh embodiment of the present disclosure;

FIG. 12 illustrates a transmitter that provides predistortion to compensate for a non-linear characteristic of a non-linear filter according to an eighth embodiment of the present disclosure;

FIG. 13 illustrates a transmitter that provides predistortion to compensate for a non-linear characteristic of a non-linear filter according to a ninth embodiment of the present disclosure;

FIG. 14 graphically compares operating regions of a typical non-linear filter with and without predistortion according to one embodiment of the present disclosure;

FIG. 15 illustrates a model of non-linear filter that separately models an undesired non-linear filter characteristic and a desired linear filter characteristic of the non-linear filter according to one embodiment of the present disclosure;

FIG. 16 illustrates one embodiment of an adaptor for adaptively configuring a predistorter that predistorts for a non-linear filter of a transmitter based on the model of the non-linear filter of FIG. 15 according to one embodiment of the present disclosure;

FIGS. 17 through 19 are more detailed illustrations of the non-linear filter model of FIG. 15 according to one embodiment of the present disclosure;

FIG. 20 illustrates an integrated model for the non-linear filter that is equivalent to the model of the non-linear filter of FIG. 15 but that can be solved using conventional adaptive filtering schemes according to one embodiment of the present disclosure;

FIG. 21 illustrates one embodiment of an adaptor for adaptively configuring a predistorter that predistorts for a non-linear filter of a transmitter based on the model of the non-linear filter of FIG. 15 where the non-linear filter model is trained using the integrated model of FIG. 20 according to one embodiment of the present disclosure;

FIG. 22 illustrates use of an integrated model for a non-linear subsystem according to one embodiment of the present disclosure;

FIG. 23 illustrates one embodiment of a transmitter including a predistorter that compensates for a non-linearity of a non-linear filter in the transmitter and an adaptor that adaptively configures the predistorter based on a reduced bandwidth feedback signal according to one embodiment of the present disclosure;

FIGS. 24A through 24D are frequency domain representations of signals at various reference points in the transmitter of FIG. 23 according to one embodiment of the present disclosure; and FIG. 25 illustrates a system including a non-linear subsystem, a predistorter that compensates for a non-linear characteristic of the non-linear subsystem, and an adaptor that adaptively configures the predistorter based on a reduced bandwidth feedback signal according to one embodiment of the present disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Systems and methods for compensating for non-linearity of a non-linear subsystem using predistortion are disclosed. Before describing these systems and methods, it is beneficial to first discuss the non-linear characteristic of a passive type filter. Specifically, FIG. 3 illustrates an input-output characteristic of a typical passive type filter. As illustrated, an output power ($P_{OUT}$) of the filter can be described as $P_{OUT} = P_{LINEAR} - P_{NON-LINEAR}$. A point "A" is a defined point below which a non-linear characteristic (i.e., a non-linear part, $P_{NON-LINEAR} = P_{LINEAR} - P_{OUT}$) of the filter is negligible and can be ignored such that, when operating below that point, the filter can be treated as a linear filter. However, in the region above point A, the non-linear characteristic ($P_{NON-LINEAR}$) gradually increases and must be taken into consideration. In other words, above point A, the filter must be treated as a non-linear filter.

The non-linear characteristic of the filter can be described by the following power series expansion equation:

$$V_{OUT}=a_0+a_1V_{IN}+a_2V_{IN}^2+a_3V_{IN}^3+ \quad (1)$$

The non-linear terms in Equation (1) describe all types of Intermodulation Distortion (IMD) signals and harmonics that will be generated by the filter. The relationship between fundamental signals and lower orders of the IMD signals and harmonics is illustrated in FIG. 4. For radio frequency front-end filters in radio frequency transmitter applications, the most significant distortion signals generated due to the non-linear characteristic of the filter are $3^{rd}$, $5^{th}$ and $7^{th}$ orders IMD signals. These orders IMD signals not only occur out of the passband, but also distribute throughout the entire passband. As such, for linearization, it is important to cancel, or at least substantially cancel these orders IMD signals from the filter output. Among other things, the systems and methods described herein utilize predistortion techniques to provide such linearization.

FIGS. 5A through 13 illustrate embodiments of a transmitter 28 that compensates for a non-linear characteristic of a non-linear filter 30 at an output of the transmitter 28 according to the present disclosure. Specifically, FIG. 5A illustrates an embodiment of the transmitter 28 that includes a digital-to-analog converter (DAC) 32, a modulator and upconverter 34, a power amplifier (PA) 36, an analog predistorter 38, and the non-linear filter 30. The DAC 32 receives a digital input signal and converts the digital input signal into an analog input signal. The modulator and upconverter 34 modulates the analog input signal according to a desired modulation scheme and upconverts the analog input signal to a desired radio frequency. The radio frequency (RF) signal output by the modulator and upconverter 34 is amplified to a desired output power level by the PA 36 to provide an amplified RF signal. In this embodiment, the analog predistorter 38 applies a predetermined, fixed predistortion to the amplified RF signal to provide a predistorted RF signal. The predistortion applied by the analog predistorter 38 compensates for the non-linear characteristic of the non-linear filter 30. The predistortion may be predetermined using any suitable technique. The predistorted signal is then filtered by the non-linear filter 30 to provide an output signal of the transmitter 28. As a result of the predistortion, the output signal is as if the non-linear filter 30 were a linear, or substantially linear, filter.

FIG. 5B is substantially the same as that of FIG. 5A but where the DAC 32 moved after the modulator and upconverter 34. FIG. 5B illustrates that the concepts discussed herein are independent of the DAC placement. Further, while not discussed further below, it should be understood that while the placement of the DACs in the embodiments below is shown as being before modulation and upconversion, the present disclosure is not limited thereto.

FIG. 6 illustrates an embodiment of the transmitter 28 that is similar to that of FIG. 5A. However, in this embodiment, the transmitter 28 also includes a digital predistorter (DPD) 40 that compensates for non-linearity of the PA 36. The digital predistorter 40 is adaptively configured by an adaptor 42 based on the digital input signal and a feedback signal. Specifically, a demodulator and downconverter 44 receives a RF feedback signal that is representative of the amplified RF signal output by the PA 38. The output of the demodulator and downconverter 44 is digitized by an analog-to-digital converter (ADC) 46 to provide the feedback signal to the adaptor 42. The adaptor 42 configures the digital predistorter 40 based on a comparison of the digital input signal and the feedback signal using any suitable adaptive predistortion scheme. For instance, in one embodiment, the digital predistorter 40 provides polynomial predistortion where the predistortion to compensate for the non-linearity of the PA 38 is defined by a polynomial having a number of configurable coefficients. The adaptor 42 adaptively configures the coefficients for the polynomial to provide the appropriate predistortion using known techniques.

FIGS. 7 through 9 illustrate embodiments of the transmitter 28 where predistortion to compensate for the non-linear characteristic of the non-linear filter 30 is performed in the digital, rather than analog, domain. Specifically, FIG. 7 illustrates an embodiment of the transmitter 28 that includes a digital predistorter (DPD) 48 that compensates for the non-linear characteristic of the non-linear filter 30, a digital predistorter (DPD) 50 that compensates for the non-linearity of the PA 36, the DAC 32, the modulator and upconverter 34, the PA 36, and the non-linear filter 30 connected as shown. The digital predistorter 48 applies a predistortion to a digital input signal to provide a first predistorted signal that has been predistorted to compensate for the non-linear characteristic of the non-linear filter 30. The digital predistorter 50 then applies a predistortion to the first predistorted signal to provide a second predistorted signal that has also been predistorted to compensate for the non-linearity of the PA 36. In this embodiment, both the predistortion applied by the digital predistorter 48 and the predistortion applied by the digital predistorter 50 are predetermined and fixed. The DAC 32 then converts the second predistorted signal to an analog signal. The analog signal from the DAC 32 is then modulated and amplified by the modulator and upconverter 34. The PA 36 then amplifies the RF signal output from the modulator and upconverter 34 to provide an amplified RF signal that is then filtered by the non-linear filter 30. Due to the predistortion applied by the digital predistorter 48, the output signal from the non-linear filter 30 is as if the non-linear filter 30 was a linear, or substantially linear, filter. Note that the digital predistorter 50, the DAC 32, the modulator and upconverter 34, and the PA 36 operate together as a linear part 52, or linear subsystem.

FIG. 8 illustrates an embodiment of the transmitter 28 where the digital predistorters 48 and 50 (FIG. 7) have been combined into a single digital predistorter (DPD) 54. The digital predistorter 54 applies a predetermined and fixed predistortion that compensates for both the non-linearity of the PA 36 and the non-linear characteristic of the non-linear filter 30.

FIG. 9 illustrates an embodiment of the transmitter 28 that is similar to that of FIG. 7. However, in this embodiment, the transmitter 28 also includes a digital predistorter (DPD) 56 that compensates for non-linearity of the PA 36. The digital predistorter 56 is adaptively configured by an adaptor 58 based on the first predistorted signal from the digital predistorter 48 and a feedback signal. Specifically, a demodulator and downconverter 60 receives a RF feedback signal that is representative of the amplified radio frequency output signal output by the PA 36. The output of the demodulator and downconverter 60 is digitized by an analog-to-digital converter (ADC) 62 to provide the feedback signal to the adaptor 58. The adaptor 58 configures the digital predistorter 56 based on a comparison of the first predistorted signal from the digital predistorter 48 and the feedback signal using any suitable adaptive predistortion scheme. For instance, in one embodiment, the digital predistorter 56 provides polynomial predistortion where the predistortion to compensate for the non-linearity of the PA 36 is defined by a polynomial having a number of configurable coefficients. The adaptor 58 adaptively configures the coefficients for the polynomial to provide the appropriate predistortion using known techniques.

FIGS. 10 through 13 illustrate embodiments of the transmitter 28 providing adaptive predistortion to compensate for the non-linear characteristic of the non-linear filter 30. Specifically, FIG. 10 illustrates an embodiment of the transmitter 28 that is similar to that of FIG. 7. However, in this embodiment, the transmitter 28 includes a digital predistorter (DPD) 64 that compensates for non-linearity of the non-linear filter 30, where the digital predistorter 64 is adaptively configured by an adaptor 66 based on the digital input signal and a feedback signal. Specifically, a demodulator and downconverter 68 receives a RF feedback signal that is representative of the output signal output by the non-linear filter 30. The output of the demodulator and downconverter 68 is digitized by an analog-to-digital converter (ADC) 70 to provide the feedback signal to the adaptor 66. The adaptor 66 configures the digital predistorter 64 based on the digital input signal and the feedback signal using any suitable adaptive predistortion scheme. For instance, in one embodiment, the digital predistorter 64 provides polynomial predistortion where the predistortion to compensate for the non-linear characteristic of the non-linear filter 30 is defined by a polynomial having a number of configurable coefficients. The adaptor 66 adaptively configures the coefficients for the polynomial to provide the appropriate predistortion.

FIG. 11 illustrates an embodiment of the transmitter 28 that is similar to that of FIG. 10. However, in this embodiment, the transmitter 28 also includes adaptive predistortion for the PA 36 in the manner described above with respect to FIG. 9.

FIGS. 12 and 13 are similar to FIGS. 10 and 11, respectively. However, in the embodiments of FIGS. 12 and 13, the digital predistorter 64 is configured by an adaptor 72 based on a reference signal that corresponds to the input signal of the non-linear filter 30 and a feedback signal that corresponds to the output signal of the non-linear filter 30.

FIG. 14 graphically illustrates operating regions for the non-linear filter 30 with and without predistortion according to one exemplary embodiment. As illustrated, point "A" is a defined boundary point below which the non-linear filter 30 is treated as linear. Without predistortion, in order to ensure linearity, the non-linear filter 30 must operate within operating region 74 where $P_{IN}$ is average input power and $P_{IN-A}$ is peak input power. Thus, in order to ensure linearity, the peak input power must be less than or equal to the input power level defined by point A. In contrast, by using predistortion to compensate for the non-linear characteristic of the non-linear filter 30, the non-linear filter 30 is enabled to operate within operating region 76. In other words, as a result of the predistortion, linearity is maintained even though the non-linear filter 30 is operating in its non-linear region. As a result, with predistortion, the non-linear filter 30 is linearized below a point "B". In this case, the average input power is $P_{IN-PD}$ and the peak input power is $P_{IN-B}$, where $P_{IN-PD}$ is much greater than $P_{IN}$ and $P_{IN-B}$ is substantially greater than $P_{IN-A}$.

The benefits of predistorting compensate for the non-linear characteristic of the non-linear filter 30 including, for example, taking greater advantage of the power handling capabilities of the non-linear filter 30. In other words, using predistortion, linearity can be maintained over a much larger power range for a particular type of filter. As a result, with predistortion, a ceramic or monoblock filter can be used for low power base stations that operate in higher power level, for example higher than 5 W, thereby avoiding the need for bulky cavity type filters. As another example, by using predistortion in the system to compensate for the nonlinearities of the cavity filters, the manufacturing yield for cavity type filters can jump right away from current 60% to nearly 100% in the first round of cavity filter manufacturing, because the non-linearity specification is no longer a requirement for the cavity filter production. In other words, the costly filter non-linearity-fixing process for the cavity filters failed in the first round can be eliminated; as a result, the average cavity filter manufacturing cost can get a great reduction. As yet another example, with predistortion, conventional miniature filters may be used for user equipment devices in next generation and future generation cellular communication networks, which require or will likely require greater dynamic power range.

Now that a number of architectures for the transmitter 28 have been described, the discussion will now turn to embodiments of the adaptor 72 of FIGS. 12 and 13. Note, however, that the concepts discussed above for the adaptor 72 can easily be extended to the adaptor 66 of FIGS. 10 and 11. In general, the adaptor 72 operates to adaptively configure the digital predistorter 64 to compensate for, or counteract, the non-linear characteristic of the non-linear filter 30. However, the digital predistorter 64 has both the undesired and unknown non-linear characteristic and a desired and known linear characteristic. The adaptor 72 is to operate such that the digital predistorter 64 compensates for only the non-linear characteristic of the non-linear filter 30. However, an issue arises in that the non-linear filter 30 is a physical device that does not include a reference point for only the non-linear characteristic. Specifically, the output of the non-linear filter 30 cannot be used as a reference point for the non-linear characteristic of the non-linear filter 30 because the output of the non-linear filter 30 represents both the non-linear characteristic and the linear characteristic of the non-linear filter 30.

FIG. 15 illustrates a model 78 for the non-linear filter 30 that can be utilized to provide a reference point for adaptive configuration of the digital predistorter 64 for predistortion of the non-linear characteristic of the non-linear filter 30 according to one embodiment of the present disclosure. While the following discussion focuses on the use of the model 78 for adaptation of the digital predistorter 64 to compensate for the non-linear characteristic of the non-linear filter 30, the model 78 is not limited thereto. The model 78 may be used to model any non-linear system, and particularly any non-linear physical device, having an undesired non-linear characteristic and a desired linear characteristic. Further, the model 78 may then be used for adaptive predistortion to compensate for the non-linear characteristic of the non-linear system.

As illustrated, the model 78 for the non-linear filter 30 is a concatenation of a non-linear filter model 80, which also referred to herein as model A, and a linear filter model 82, which is also referred to herein as model B. The non-linear filter model 80 is a model of the undesired and unknown non-linear characteristic of the non-linear filter 30. The non-linear characteristic of the non-linear filter 30 may vary over time and/or may vary from one device to another. The linear filter model 82 is a model of the desired and known linear characteristic of the non-linear filter 30. In other words, the linear filter model 82 is a model of the known linear characteristic of the non-linear filter 30 when operating in its linear region. The linear characteristic does not vary over time and is known either by design or by measurement on a per device basis to take device variations into consideration. Together, the concatenation of the non-linear filter model 80 and the linear filter model 82 represent the actual response of the non-linear filter 30 particularly when operating in its non-linear region.

As discussed below, the non-linear filter model 80 may model the non-linear characteristic of the non-linear filter 30 using a variable tapped delay line followed by a weighting and summation with a number of coefficients (determined via adaptation). As a special case, when there is only one tap, the non-linear filter model 80 is a memory-less non-linear function. In this case, the output of the non-linear filter model 80 only depends on the current input of the non-linear filter model 80 and not any of its previous inputs.

It is important to note that although the non-linear filter 30 is modeled as a concatenation of the non-linear filter model 80 followed by the linear filter model 82, the non-linear filter 30 is physically a single device. As such, there is no physical reference point obtainable from the non-linear filter 30 that is equivalent to the reference point at the output of the non-linear filter model 80. The model 78 provides the needed reference point for adaptive predistortion to compensate for the non-linear characteristic and not the linear characteristic of the non-linear filter 30.

FIG. 16 illustrates one embodiment of the adaptor 72 that utilizes the model 78 of FIG. 15 to adaptively configure the digital predistorter 64 to compensate for the non-linear characteristic of the non-linear filter 30 according to one embodiment of the present disclosure. Note that the adaptor 72 may be implemented as any suitable type of circuitry such as, for example, one or more Application Specific Integrated Circuits (ASICs) or one or more microprocessors. As illustrated, the adaptor 72 includes a first loop, which is referred to herein as a non-linear filter model identification loop, and a second loop, which is referred to herein as a predistorter model identification loop. The non-linear filter model identification loop includes the model 78, which as discussed above is a concatenation of the non-linear filter model 80 followed by the linear filter model 82, and a subtraction function 84. In general, the non-linear filter model identification loop operates to provide a reference signal at reference point 86. The reference signal at the reference point 86 is referred to herein as a reference signal for the non-linear characteristic of the non-linear filter 30. Again, the reference signal for the non-linear characteristic of the non-linear filter 30 is not directly obtainable from the non-linear filter 30 since the non-linear filter 30 is a single physical device.

The predistorter model identification loop includes the non-linear filter model 80, an inverse model 88, and a subtraction function 90. The inverse model 88 is an inverse model of the non-linear filter model 80. In operation, the predistorter model identification loop obtains the parameters, which in this embodiment are coefficients ($C_{PD}$), for configuring the digital predistorter 64. Specifically, in this embodiment, since the inverse model 88 is an inverse model of the non-linear filter model 80 and the non-linear filter model 80 is a model of the non-linear characteristic of the non-linear filter 30, the coefficients ($C_{PD}$) provided to the digital predistorter 64 are the same coefficients determined for the inverse model 88 via the predistorter model identification loop.

In operation, the adaptor 72 first trains the non-linear filter model 80 using the non-linear filter model identification loop. During this training, parameters, which in this embodiment are coefficients, for the non-linear filter model 80 are determined. Once the non-linear filter model 80 is trained, the predistorter model identification loop trains the inverse model 88. More specifically, an output signal from the linear part 52 of the transmitter 28 is provided as an input signal to the adaptor 72. Once the non-linear filter model 80 is trained, the adaptor 72 provides the input signal of the adaptor 72 to the non-linear filter model 80, and the non-linear filter model 80 outputs, at the reference point 86, the reference signal for the non-linear characteristic of the non-linear filter 30. The adaptor 72 then provides the reference signal for the non-linear characteristic of the non-linear filter 30 to the inverse model 88, which then provides a corresponding output signal. The subtraction function 90 compares the output of the inverse model 88 and the input signal to the adaptor 72 to provide an error signal. The error signal represents a difference between the output of the inverse model 88 and the input signal of the adaptor 72. The adaptor 72 updates the coefficients for the inverse model 88 based on the error signal until the error signal is minimized (e.g., until the error signal is zero or approximately zero). At that point, the inverse model 88 is trained, and the adaptor 72 provides the coefficients for the inverse model 88 to the digital predistorter 64 as the coefficients ($C_{PD}$) for the digital predistorter 64. This process continues such that the adaptor 72 continues to update the coefficients for the non-linear filter model 80, the inverse model 88, and the digital predistorter 64 in response to variations in the non-linear characteristic of the non-linear filter 30.

Before proceeding, as discussed above with respect to the model 78, while the adaptor 72 of FIG. 16 is shown as being used to adaptively configure the digital predistorter 64 to compensate for the non-linear characteristic of the non-linear filter 30 in the transmitter 28, the adaptor 72 is not limited thereto. The adaptor 72 of FIG. 16 may be used to adaptively configure a predistorter to compensate for a non-linear characteristic of any type of non-linear system or non-linear device that has both an undesired non-linear characteristic and a desired linear characteristic.

FIG. 17 through 21 describe systems and methods for training the non-linear filter model 80. Note, however, that the systems and methods of FIGS. 17 through 21 are exemplary. Other techniques may be used to train the non-linear filter model 80. However, FIGS. 17 through 21 describe one scheme that enables conventional adaptive filtering techniques to be used to train the non-linear filter model 80.

More specifically, FIG. 17 is a more detailed illustration of the non-linear filter model 80 according to one embodiment of the present disclosure. As shown, the non-linear filter model 80 includes a number ($P_A$) of memory basis functions 92 and a weight and sum function 94. The number $P_A$ is equal to the number of coefficients for the non-linear filter model 80. The memory basis functions 92 receive the input signal of the non-linear filter model 80, which is denoted $x_{A,IN}(n)$, and output corresponding memory basis function output signals $x_{A,BF\_M\_1}(n)$ through $x_{A,BF\_M\_P_A}(n)$. The weight and sum function 94 applies coefficients ($C_A$) for the non-linear filter model 80 as weightings to the corresponding memory basis function output signals $x_{A,BF\_M\_1}(n)$ through $x_{A,BF\_M\_P_A}(n)$ and then sums the weighted basis function output signals to provide the output signal of the non-linear filter model 80, which is denoted as $x_{A,\ OUT}(n)$.

FIG. 18 is a more detailed illustration of the memory basis functions 92 of FIG. 17 according to one embodiment of the present disclosure. As illustrated, the memory basis functions 92 include a number ($K_A$) of memory-less basis functions 96 and a number ($K_A$) of memory structures 98-1 through 98-$K_A$. Each of the memory structures 98-1 through 98-$K_A$ has a number ($Q_A$) of taps, where $K_A \times Q_A = P_A$. The memory-less basis functions 96 receive the input signal of the non-linear filter model 80, which is denoted $x_{A\_IN}(n)$, and output corresponding memory-less basis function output signals $x_{A,BF\_ML\_1}(n)$ through $x_{A,BF\_ML\_K_A}(n)$. The memory structures 98-1 through 98-$K_A$ receive the memory-less basis function output signals $x_{A,BF\_ML\_1}(n)$ through $x_{A,BF\_ML\_P_A}(n)$ and output the memory basis function output signals $x_{A,BF\_M\_1}(n)$ through $x_{A,BF\_M\_(K_A Q_A)}(n)$.

FIG. 19 illustrates the memory-less basis functions 96 of FIG. 18 in more detail according to one embodiment of the present disclosure. As illustrated, the memory-less basis functions 96 includes a number ($K_A$) of memory-less basis functions 100-1 through 100-$K_A$.

When looking at the model 78, the weight and sum function 94 where the coefficients ($C_A$) are applied is at the middle of the model 78. This is not desirable for direct application of adaptive filtering schemes to solve for, or otherwise determine, the coefficients ($C_A$). Rather, it is desirable for the application of the coefficients ($C_A$) to be at the final stage of the model 78. FIG. 20 illustrates an integrated model 102 that is equivalent to the model 78 but where stages have been rearranged such that the application of the coefficients ($C_A$) is at a final stage of the integrated model 102. More specifically, in the model 78, the weight and sum function 94 and the linear filter model 82 are both linear. As such, the sequence of the weight and sum function 94 and the linear filter 82 can be reversed as is done in the integrated model 102. In the integrated model 102, the memory basis function output signals $x_{A,BF\_M\_1}(n)$ through $x_{A,BF\_M\_P_A}(n)$ are passed through corresponding linear filter models 104-1 through 104-$P_A$ to provide corresponding basis function output signals $x_{A,BF\_IM\_1}(n)$ through $X_{A,BF\_IM\_P_A}(n)$. The linear filter models 104-1 through 104-$P_A$ are equivalent to the linear filter model 82, which has known coefficients ($C_B$). Thus, the memory basis functions 92 and the linear filter models 104-1 through 104-$P_A$ become basis functions for the integrated model 102. The weight and sum function 94 then applies the coefficients ($C_A$) as weightings to the corresponding basis function output signals $x_{A,BF\_IM\_1}(n)$ through $X_{A,BF\_IM\_P_A}(n)$ and then sums the weighted basis function output signals to provide the output signal $x_{OUT}(n)$ of the integrated model 102, which is equivalent to the output signal $x_{OUT}(n)$ of the model 78.

Using the integrated model 102, the coefficients ($C_A$) for the non-linear filter model 80 can be determined using adaptive filtering. Specifically, let a $P_A \times 1$ vector $X_{A,BF\_IM}(n)$ be defined as:

$$X_{A,BF\_IM}(n) = [x_{A,BF\_IM\_1}(n), x_{A,BF\_IM\_2}(n), \ldots, x_{A,BF\_IM\_P_A}(n)]^T,$$

where "T" denotes transpose. Over $n = n_1, n_2, \ldots, n_N$ where $n_N$ is the number of samples used for one adaptation iteration, the memory basis function output signals $x_{A,BF\_IM\_1}(n)$ through $x_{A,BF\_IM\_P_A}(n)$ are organized in a $N \times P_A$ matrix $X_A$ as:

$$X_A = [X_{A,BF\_IM}(n_1), X_{A,BF\_IM}(n_2), \ldots, X_{A,BF\_IM}(n_N)]^T.$$

A known adaptive filtering algorithm can then be used to solve the following equation for the coefficients ($C_A$) for the non-linear filter model 80:

$$X_A \cdot C_A = X'_{OUT},$$

where $C_A$ is a vector of the coefficients for the non-linear filter model 80 defined as:

$$C_A = [c_{A\_1}, c_{A\_2}, \ldots, c_{A\_P_A}]^T,$$

where $c_{A\_1}, c_{A\_2}, \ldots, C_{A\_P_A}$ are the coefficients for the non-linear filter model 80. $X'_{OUT}$ is defined as:

$$X'_{OUT} = [x'_{OUT}(n_1), x'_{OUT}(n_2), \ldots, x'_{OUT}(n_N)]^T,$$

where $X'_{OUT}$ is the output of the actual non-linear subsystem, which in this case is the non-linear filter 30.

FIG. 21 illustrates an embodiment of the adaptor 72 that utilizes the integrated model 102 of FIG. 20 to train the non-linear filter model 80 to adaptively configure the digital predistorter 64 to compensate for the non-linear characteristic of the non-linear filter 30 according to one embodiment of the present disclosure. This embodiment of the adaptor 72 is similar to that of FIG. 16, but where the integrated model 102 is utilized for training the non-linear filter model 80. As illustrated, the adaptor 72 includes a first loop, which is referred to herein as a non-linear filter model identification loop, and a second loop, which is referred to herein as a predistorter model identification loop. The non-linear filter model identification loop includes the integrated model 102 and a subtraction function 106 and is utilized by the adaptor 72 to train the non-linear filter model 80. More specifically, the output of the linear part 52 of the transmitter 28 (or the input of the non-linear filter 30), is received as the input signal of the adaptor 72. The adaptor 72 passes the input signal through the integrated model 102 to provide the output signal of the integrated model 102. The subtraction function 106 compares the output signal of the integrated model 102 and a feedback signal that represents the output signal of the non-linear filter 30 to provide an error signal that represents a difference between the output signal of the integrated model 102 and the feedback signal. Based on the error signal, the adaptor 72 trains the coefficients ($C_A$) for the integrated model 102 until the error signal has been minimized (e.g., reduced to zero or approximately zero). This process continues such that the coefficients ($C_A$) are updated in response to variations in the non-linear characteristic of the non-linear filter 30.

The predistorter model identification loop includes the non-linear filter model 80, the inverse model 88, and the subtraction function 90, as described above with respect to FIG. 16. Again, the inverse model 88 is an inverse model of the non-linear filter model 80. In operation, once initial training of the inverse model 102 is complete, the coefficients ($C_A$) determined for the non-linear filter model 80 using the integrated model 102 are utilized in the predistorter model identification loop to train the inverse model 88. More specifically, the adaptor 72 passes the input signal of the adaptor 72 through the non-linear filter model 80 (which is configured with the coefficients ($C_A$) determined using the integrated model 102) to provide the reference signal for the non-linear characteristic of the non-linear filter 30 at the reference point 86. The adaptor 72 then provides the reference signal for the non-linear characteristic of the non-linear filter 30 to the inverse model 88, which then provides a corresponding output signal. The subtraction function 90 compares the output of the inverse model 88 and the input signal to the adaptor 72 to provide an error signal. The error signal represents a difference between the output of the inverse model 88 and the input signal of the adaptor 72. The adaptor 72 updates the coefficients for the inverse model based on the error signal until the error signal is minimized (e.g., until the error signal is zero or approximately zero). At that point, the inverse model 88 is trained, and the adaptor 72 provides the coefficients for the inverse model 88 to the digital predistorter 64 as the coefficients ($C_{PD}$) for the digital predistorter 64. This process continues such that the adaptor 72 continues to update the coefficients for the non-linear filter model 80, the inverse model 88, and the digital predistorter 64 in response to variations in the non-linear characteristic of the non-linear filter 30.

Before proceeding, again, while the adaptor 72 of FIG. 21 is shown as being used to adaptively configure the digital predistorter 64 to compensate for the non-linear characteristic of the non-linear filter 30 in the transmitter 28, the adaptor 72 is not limited thereto. The adaptor 72 of FIG. 21 may be used to adaptively configure a predistorter to compensate for a non-linear characteristic of any type of non-linear system or non-linear device that has both an undesired non-linear characteristic and a desired linear characteristic.

FIG. 22 illustrates a system 108 that utilizes the integrated model 102 to train a non-linear characteristic of a non-linear subsystem 110 according to one embodiment of the present disclosure. The non-linear subsystem 110 is generally any type of non-linear subsystem that includes an undesired non-linear characteristic and a desired linear characteristic. Using the integrated model 102, an adaptive filtering technique is used in order to train a non-linear model for the non-linear characteristic of the non-linear subsystem 110 in the manner described above. Specifically, an input signal, $x_{IN}(n)$, is provided to the non-linear subsystem 110 and the integrated model 102. A subtraction function 112 compares an output signal, $x'_{OUT}(n)$, of the non-linear subsystem 110 and an output signal, $x_{OUT}(n)$, of the integrated model 102 to provide an error signal to the integrated model 102 that represents a difference between the two output signals $x_{OUT}(n)$ and $x'_{OUT}(n)$. Based on the error signal, coefficients for the integrated model 102, which are also the coefficients for the non-linear model of the non-linear characteristic of the non-linear subsystem 110, are updated to minimize the error signal (e.g., updated to make the error signal zero or approximately zero). The coefficients determined for the non-linear model of the non-linear characteristic of the non-linear subsystem 110 may then be used to, for example, predistort the input signal to compensate for the non-linear characteristic of the non-linear subsystem 110 in the manner described above.

FIG. 23 illustrates another embodiment transmitter 28 including the adaptor 72 that provides bandwidth reduction for the adaptor 72 according to one embodiment of the present disclosure. Specifically, this embodiment reduces a bandwidth that the adaptor 72 processes as compared to a bandwidth of the output signal of the non-linear filter 30, which may be at or above the limit of the processing speed of current state-of-the-art ASICs or microprocessors without employing techniques specifically for handling higher than clock rate signal processing. Reducing the bandwidth being processed by the adaptor 72 limits the complexity and thus the cost of implementing the adaptor 72. Reducing the bandwidth also enables linearization for non-linear systems of wider bandwidths or, in other words, increases a maximum bandwidth for which linearization can be performed beyond a maximum bandwidth that can be handled by the hardware (e.g., ASIC or microprocessor) in which the adaptor 72 is implemented. This embodiment of the adaptor 72 is similar to that of FIG. 16.

For this embodiment, the non-linear filter model 80 is, or can be approximated as, a memory-less non-linear function. This means that the output of the non-linear filter model 80 depends only on the current input (or approximately so), and does not give significant contribution to the current output of the non-linear filter model 80. Any dependency of the output of the non-linear filter model 80 on previous inputs can be ignored. Because the non-linear filter model 80 is or can be approximately a memory-less non-linear function, the non-linear characteristic of the non-linear filter 30 is frequency independent or can be approximately assumed to be frequency independent. This can be assumed true as long as the frequency dependency of the non-linear characteristic can be modeled by a concatenation of a frequency independent non-linear filter model 80 followed by the linear filter model 82, which can be frequency dependent.

In order to reduce the bandwidth processed by the adaptor 72, the transmitter 28 includes a narrowband filter 114 that receives a feedback signal that is representative of the output signal of the non-linear filter 30 and outputs a filtered feedback signal having a significantly reduced bandwidth. Preferably, the bandwidth of the narrowband filter 114 is arbitrarily small. However, in implementation, the bandwidth of the narrowband filter 114 is substantially smaller than the bandwidth of the output signal of the non-linear filter 30, but the actual bandwidth of the narrowband filter 114 may be a tradeoff between performance and cost/complexity.

As illustrated, the adaptor 72 includes a first loop, which is referred to herein as a non-linear filter model identification loop, and a second loop, which is referred to herein as a predistorter model identification loop. The non-linear filter model identification loop includes a model 116 of a subsystem formed by the non-linear filter 30 and the narrowband filter 114 and the subtraction function 84. The model 116 includes the model 78 of the non-linear filter 30, which includes the non-linear filter model 80 and the linear filter model 82, and a narrowband filter model 118. The narrowband filter model 118 is a model of the narrowband filter 114, which is known. Notably, the narrowband filter 114 may be implemented in the analog or digital domain, and, likewise, the narrowband filter model 118 is implemented in the digital domain. The narrowband filter model 118 may be known from design or from measurements on a per device basis. Notably, while shown separately, the linear filter model 82 and the narrowband filter model 118 are both linear and, as such, can be combined into or treated as a single linear model. From this point, the adaptor 72 operates in the same manner as described above with respect to FIG. 16. Further, the integrated model 102 (FIG. 21) may be used to train the non-linear filter model 80 in the manner described above.

FIGS. 24A through 24D are frequency domain illustrations of exemplary signals at reference points A through C in FIG. 23. FIG. 24A illustrates the input signal to the non-linear filter 30 at reference point A in FIG. 23. As illustrated, the input signal has a wide bandwidth. FIG. 24B illustrates the output signal at the output of the non-linear filter 30 at reference point B in FIG. 23. As illustrated, the output signal includes undesired distortions, including distortions in the passband of the non-linear filter 30. FIG. 24C illustrates a frequency response of the narrowband filter 114 of FIG. 23. As illustrated, the bandwidth ($BW_1$) of the narrowband filter 114 is substantially smaller than the bandwidth of the output signal of the non-linear filter 30. FIG. 24D illustrates the filtered feedback signal (i.e., filtered output signal of the non-linear filter 30) at reference point C of FIG. 23. As illustrated, the bandwidth of the filtered feedback signal is equal to the bandwidth ($BW_1$) of the narrowband filter 114.

Again, while the adaptor 72 of FIG. 23 is shown as being used to adaptively configure the digital predistorter 64 to compensate for the non-linear characteristic of the non-linear filter 30 in the transmitter 28, the adaptor 72 is not limited thereto. As shown in FIG. 25, the adaptor 72 in combination with the digital predistorter 64 and the narrowband filter 114 can be used to provide adaptive predistortion to compensate for a non-linear characteristic of any type of non-linear subsystem 122 (e.g., a non-linear power amplifier).

In the embodiments described herein, various parts can be implemented in either the analog domain or the digital domain and in either baseband or radio frequency. The concepts disclosed herein do not put restrictions on the detailed implementation, which could be determined jointly considering other aspects of the system.

The following acronyms are used throughout this disclosure.
4G $4^{th}$ Generation
ADC Analog-to-Digital Converter
ASIC Application Specific Integrated Circuit
BAW Bulk Acoustic Wave
DAC Digital-to-Analog Converter
DPD Digital Predistorter
FBAR Film Bulk Acoustic Resonator
IMD Intermodulation Distortion
LTE Long Term Evolution
PA Power Amplifier
RF Radio Frequency
SAW Surface Acoustic Wave
W Watt Those skilled in the art will recognize improvements and modifications to the preferred embodiments of the present disclosure. All such improvements and modifications are considered within the scope of the concepts disclosed herein and the claims that follow.

What is claimed is:

1. A system comprising:
a non-linear subsystem configured to receive an input signal and provide an output signal;
a predistorter configured to operate on an input signal of the predistorter to effect predistortion of the input signal of the non-linear subsystem to compensate for a non-linear characteristic of the non-linear subsystem;
a narrowband filter configured to receive a feedback signal representative of the output signal of the non-linear subsystem and output a filtered feedback signal having a bandwidth that is less than a bandwidth of the input signal of the predistorter; and
an adaptor configured to adaptively configure the predistorter based on the filtered feedback signal.

2. The system of claim 1 wherein the non-linear characteristic of the non-linear subsystem is memory-less.

3. The system of claim 1 wherein the adaptor is configured to adaptively configure the predistorter based on the filtered feedback signal, an input signal of the adaptor that is representative of the input signal of the non-linear subsystem, and a model of the non-linear subsystem and the narrowband filter.

4. The system of claim 3 wherein the model of the non-linear subsystem and the narrowband filter is a concatenation of a non-linear model of the non-linear characteristic of the non-linear subsystem followed by a linear model of the narrowband filter.

5. The system of claim 3 wherein the model of the non-linear subsystem and the narrowband filter is a concatenation of a non-linear model of the non-linear characteristic of the non-linear subsystem followed by at least one linear model that models a linear characteristic of the non-linear subsystem and the narrowband filter.

6. The system of claim 5 wherein in order to adaptively configure the predistorter based on the filtered feedback signal, the input signal of the adaptor, and the model of the non-linear subsystem and the narrowband filter, the adaptor is further configured to:
train the non-linear model based on the input signal of the adaptor and the filtered feedback signal; and
configure the predistorter based on the non-linear model such that the predistorter effects predistortion of the input signal of the non-linear subsystem to compensate for the non-linear characteristic but not the linear characteristic of the non-linear subsystem.

7. The system of claim 6 wherein in order to configure the predistorter based on the non-linear model, the adaptor is further configured to:
provide the input signal of the adaptor to the non-linear model such that the non-linear model outputs a reference signal for the non-linear characteristic of the non-linear subsystem;
train an inverse model of the non-linear model based on the input signal of the adaptor and the reference signal for the non-linear characteristic of the non-linear subsystem; and
provide one or more parameters that define the inverse model to the predistorter to thereby configure the predistorter.

8. The system of claim 7 wherein the one or more parameters are a plurality of coefficients.

9. The system of claim 7 wherein in order to train the non-linear model, the adaptor is further configured to:
provide the input signal of the adaptor to an integrated model such that the integrated model provides an output signal, wherein the integrated model is equivalent to the model of the non-linear subsystem and the narrowband filter but applies coefficients that define the non-linear model at a final stage of the integrated model; and
configure the non-linear model of the non-linear subsystem based on the output signal of the integrated model and the filtered feedback signal that represents the output signal of the non-linear subsystem using an adaptive filtering scheme.

10. The system of claim 9 wherein the integrated model comprises:
a plurality of memory basis functions of the non-linear model that provide a corresponding plurality of memory basis function output signals based on the input signal of the adaptor;
a plurality of linear models each corresponding to the at least one linear model that models the linear characteristic of the non-linear subsystem and the narrowband filter, wherein the plurality of linear models receive the plurality of memory basis function output signals from the plurality of memory basis functions of the non-linear model and output a corresponding plurality of memory basis function output signals for the integrated model; and
a weight and sum function that weights and sums the plurality of memory basis function output signals for the integrated model based on a plurality of coefficients for the non-linear model to provide the output signal of the integrated model.

11. A transmitter comprising:
a power amplifier configured to amplify a radio frequency input signal to provide an amplified radio frequency signal;
a non-linear filter configured to receive the amplified radio frequency signal as an input signal of the non-linear filter and filter the amplified radio frequency signal to provide an output signal of the non-linear filter, the non-linear filter having a linear characteristic and a non-linear characteristic;
a predistorter configured to operate on an input signal of the predistorter to effect predistortion of the input signal of the non-linear filter to compensate for the non-linear characteristic of the non-linear filter;
a narrowband filter configured to receive a feedback signal representative of the output signal of the non-linear filter and output a filtered feedback signal having a bandwidth that is less than a bandwidth of the input signal of the predistorter; and
an adaptor configured to adaptively configure the predistorter based on the filtered feedback signal.

12. The transmitter of claim 11 wherein the non-linear characteristic of the non-linear filter is memory-less.

13. The transmitter of claim 11 wherein the adaptor is configured to adaptively configure the predistorter based on the filtered feedback signal, an input signal of the adaptor that is representative of the input signal of the non-linear filter, and a model of the non-linear filter and the narrowband filter.

14. The transmitter of claim 13 wherein the model of the non-linear filter and the narrowband filter is a concatenation of a non-linear filter model of the non-linear characteristic of the non-linear filter followed by a linear filter model of the narrowband filter.

15. The transmitter of claim 13 wherein the model of the non-linear filter and the narrowband filter is a concatenation of a non-linear filter model of the non-linear characteristic of the non-linear filter followed by at least one linear filter model that models a linear characteristic of the non-linear filter and the narrowband filter.

16. The transmitter of claim 15 wherein in order to adaptively configure the predistorter based on the filtered feedback signal, the input signal of the adaptor, and the model of the non-linear filter and the narrowband filter, the adaptor is further configured to:
train the non-linear filter model based on the input signal of the adaptor and the filtered feedback signal; and
configure the predistorter based on the non-linear filter model such that the predistorter effects predistortion of the input signal of the non-linear filter to compensate for the non-linear characteristic but not the linear characteristic of the non-linear filter.

17. The transmitter of claim 16 wherein in order to configure the predistorter based on the non-linear filter model, the adaptor is further configured to:
provide the input signal of the adaptor to the non-linear filter model such that the non-linear filter model outputs a reference signal for the non-linear characteristic of the non-linear filter;
train an inverse model of the non-linear filter model based on the input signal of the adaptor and the reference signal for the non-linear characteristic of the non-linear filter; and
provide one or more parameters that define the inverse model to the predistorter to thereby configure the predistorter.

18. The transmitter of claim 17 wherein the one or more parameters are a plurality of coefficients.

19. The transmitter of claim 17 wherein in order to train the non-linear filter model, the adaptor is further configured to:
provide the input signal of the adaptor to an integrated model such that the integrated model provides an output signal, wherein the integrated model is equivalent to the model of the non-linear filter and the narrowband filter but applies coefficients that define the non-linear filter model at a final stage of the integrated model; and
configure the non-linear filter model of the non-linear filter based on the output signal of the integrated model and the filtered feedback signal that represents the output signal of the non-linear subsystem using an adaptive filtering scheme.

20. The transmitter of claim 19 wherein the integrated model comprises:
a plurality of memory basis functions of the non-linear filter model that provide a corresponding plurality of memory basis function output signals based on the input signal of the adaptor;
a plurality of linear models each corresponding to the at least one linear filter model that models the linear characteristic of the non-linear filter and the narrowband filter, wherein the plurality of linear models receive the plurality of memory basis function output signals from the plurality of memory basis functions of the non-linear filter model and output a corresponding plurality of memory basis function output signals for the integrated model; and
a weight and sum function that weighs and sums the plurality of memory basis function output signals for the integrated model based on a plurality of coefficients for the non-linear filter model to provide the output signal of the integrated model.

* * * * *